United States Patent
Han et al.

(10) Patent No.: US 11,790,687 B2
(45) Date of Patent: Oct. 17, 2023

(54) DISPLAY DEVICE AND MOBILE TERMINAL INCLUDING SAME

(71) Applicant: LG Display Co., Ltd., Seoul (KR)

(72) Inventors: Man Hyeop Han, Paju-si (KR); Joung Mi Choi, Paju-si (KR); Dong Gun Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/361,241

(22) Filed: Jun. 28, 2021

(65) Prior Publication Data

US 2022/0019757 A1    Jan. 20, 2022

(30) Foreign Application Priority Data

Jul. 16, 2020    (KR) ......................... 10-2020-0087901

(51) Int. Cl.
| | |
|---|---|
| *G06V 40/13* | (2022.01) |
| *G09G 3/3233* | (2016.01) |
| *H10K 39/32* | (2023.01) |
| *H10K 59/40* | (2023.01) |

(52) U.S. Cl.
CPC ....... *G06V 40/1318* (2022.01); *G09G 3/3233* (2013.01); *H10K 39/32* (2023.02); *H10K 59/40* (2023.02); *G09G 2300/0421* (2013.01); *G09G 2360/14* (2013.01)

(58) Field of Classification Search
None
See application file for complete search history.

(56) References Cited

U.S. PATENT DOCUMENTS

| | | | | |
|---|---|---|---|---|
| 2010/0103081 | A1* | 4/2010 | Takasugi | G09G 3/3233 313/505 |
| 2011/0221723 | A1* | 9/2011 | Kurokawa | G06F 3/042 345/207 |
| 2012/0154337 | A1* | 6/2012 | Kurokawa | G06F 3/0412 257/E31.095 |
| 2019/0279566 | A1* | 9/2019 | Wang | G09G 3/3241 |
| 2019/0310724 | A1* | 10/2019 | Yeke Yazdandoost | H01L 27/3227 |
| 2020/0321387 | A1* | 10/2020 | Jang | H01L 27/14636 |
| 2020/0342196 | A1* | 10/2020 | Chang | G09G 3/3655 |

(Continued)

FOREIGN PATENT DOCUMENTS

| | | |
|---|---|---|
| KR | 10-2016-0078743 A | 7/2016 |
| KR | 10-2017-0113361 A | 10/2017 |

(Continued)

*Primary Examiner* — Benjamin X Casarez
(74) *Attorney, Agent, or Firm* — POLSINELLI PC

(57) ABSTRACT

A display device and a mobile terminal including the same includes a display area in which a first group of display pixels to which pixel data is written are arranged, and a sensing area in which a second group of display pixels and a plurality of sensor pixels are arranged; each of the display pixels includes a pixel circuit configured to drive a light emitting element; each of the sensor pixels includes a photosensor driving circuit configured to drive a photodiode; a low potential power voltage and a pixel driving voltage are applied to the pixel circuit and the photosensor driving circuit; a cathode electrode of the light emitting element and the cathode electrode of the photodiode share the same metal electrode, and are commonly connected to a low potential power line to which the low potential power voltage is applied.

19 Claims, 29 Drawing Sheets

(56) References Cited

U.S. PATENT DOCUMENTS

| | | | | |
|---|---|---|---|---|
| 2020/0387684 A1* | 12/2020 | Setlak | ................ | H01L 27/3234 |
| 2020/0394381 A1* | 12/2020 | Ryu | ................... | G06V 40/1318 |
| 2021/0042493 A1* | 2/2021 | Lius | ................... | G06V 40/1318 |
| 2021/0158751 A1* | 5/2021 | Cha | ....................... | H01L 27/288 |
| 2021/0249495 A1* | 8/2021 | Lee | ......................... | H01L 25/18 |
| 2021/0326623 A1* | 10/2021 | Kato | ..................... | G01J 1/0492 |
| 2021/0342423 A1* | 11/2021 | Yoneda | ................ | H01L 25/167 |
| 2021/0406504 A1* | 12/2021 | Zheng | ................... | G06V 40/1318 |
| 2022/0012453 A1* | 1/2022 | Choi | ................... | H01L 27/3265 |

FOREIGN PATENT DOCUMENTS

| | | |
|---|---|---|
| KR | 10-2018-0059634 A | 6/2018 |
| KR | 10-2019-0090241 A | 9/2019 |

\* cited by examiner

DISPLAY DEVICE AND MOBILE TERMINAL INCLUDING SAME

CROSS-REFERENCE TO RELATED APPLICATION

This application claims priority to and the benefit of Korean Patent Application No. 10-2020-0087901, filed Jul. 16, 2020, which is hereby incorporated by reference in its entirety.

BACKGROUND

Field of the Disclosure

The present disclosure relates to a display device and a mobile terminal including the same.

Description of the Background

Electroluminescent display devices are roughly classified into inorganic light emitting display devices and organic light emitting display devices depending on the material of an emission layer. The organic light emitting display device of an active matrix type includes an organic light emitting diode (hereinafter, referred to as "OLED") that emits light by itself, and has an advantage in that the response speed is fast and the luminous efficiency, luminance, and viewing angle are large. In the organic light emitting display device, the OLED is formed in each pixel. The organic light emitting display device has a fast response speed, excellent luminous efficiency, luminance, and viewing angle, and has excellent contrast ratio and color reproducibility since it can express black gradations in complete black.

Recently, there is a trend that the organic light emitting display device is widely applied to a display device of a mobile terminal. A biometric recognition technique is applied to user authentication of the mobile terminal. As an example of the biometric recognition technique, a fingerprint sensor is widely applied to a smartphone since it provides security and convenience in the user authentication process. The fingerprint sensor applied to the smartphone senses a user's fingerprint when screen unlocking, user authentication, or the like is required.

Due to the fingerprint sensor, there have been many restrictions on the screen design of the smartphone. For example, a conventional button-type fingerprint sensor was placed below the screen of a display device, and thus it was an obstacle which made it impossible to expand the screen size to implement a full-screen display. In order to implement a full-screen display, a fingerprint recognition on display (FOD) technique has been developed in which a fingerprint sensor is placed in a lower portion of the screen of a display device and a fingerprint is sensed on the screen. In order to implement FOD, since a camera needs to be placed below the screen, the thickness of the display device increases, and the assembly process of a display panel and the camera is added, resulting in a problem of lowering yield and increasing manufacturing cost.

SUMMARY

Accordingly, the present disclosure is to solve the aforementioned necessities and/or problems.

In particular, the present disclosure provides a display device and a mobile terminal including the same, in which a photosensor is embedded in a display panel, so that the assembly process of the display panel and a fingerprint sensor module is not required, and the exposure time of a photosensor can be sufficiently secured and adjusted.

It should be noted that the present disclosure is not limited to the above-described features, and other features of the present disclosure will be apparent to those skilled in the art from the following descriptions.

A display device according to an aspect of the present disclosure includes a display area in which a first group of display pixels to which pixel data is written are arranged, and a sensing area in which a second group of display pixels and a plurality of sensor pixels are arranged.

Each of the display pixels includes a pixel circuit configured to drive a light emitting element. Each of the sensor pixels includes a photosensor driving circuit configured to drive a photodiode. A low potential power voltage and a pixel driving voltage are applied to the pixel circuit and the photosensor driving circuit. A cathode electrode of the light emitting element and a cathode electrode of the photodiode share the same metal electrode, and are commonly connected to a low potential power line to which the low potential power voltage is applied.

A mobile terminal according to an aspect of the present disclosure includes the above display device.

In the present disclosure, the sensor pixels for sensing a fingerprint are embedded in the display panel together with pixels. The present disclosure may simplify the structure of the display panel by sharing a power line and a signal line in the pixel driving circuit and the photosensor driving circuit, and disposing electrodes of the light emitting element and the photodiode on the same layer.

The present disclosure may reset and expose the sensor pixels without fluctuation in luminance of display pixels, by lowering the pixel driving voltage and the low potential power voltage applied to the display pixels and the sensor pixels sharing power lines by the same fluctuation width during the exposure time of the sensor pixels.

Further, the present disclosure may optimally adjust sensing accuracy and sensitivity by extending the exposure time of the sensor pixel up to the active interval.

Effects which can be achieved by the present disclosure are not limited to the above-mentioned effects. That is, other features that are not mentioned may be obviously understood by those skilled in the art to which the present disclosure pertains from the following description.

BRIEF DESCRIPTION OF THE DRAWINGS

The above and other features and advantages of the present disclosure will become more apparent to those of ordinary skill in the art by describing exemplary aspects thereof in detail with reference to the attached drawings, in which.

DETAILED DESCRIPTION

Figure 1:
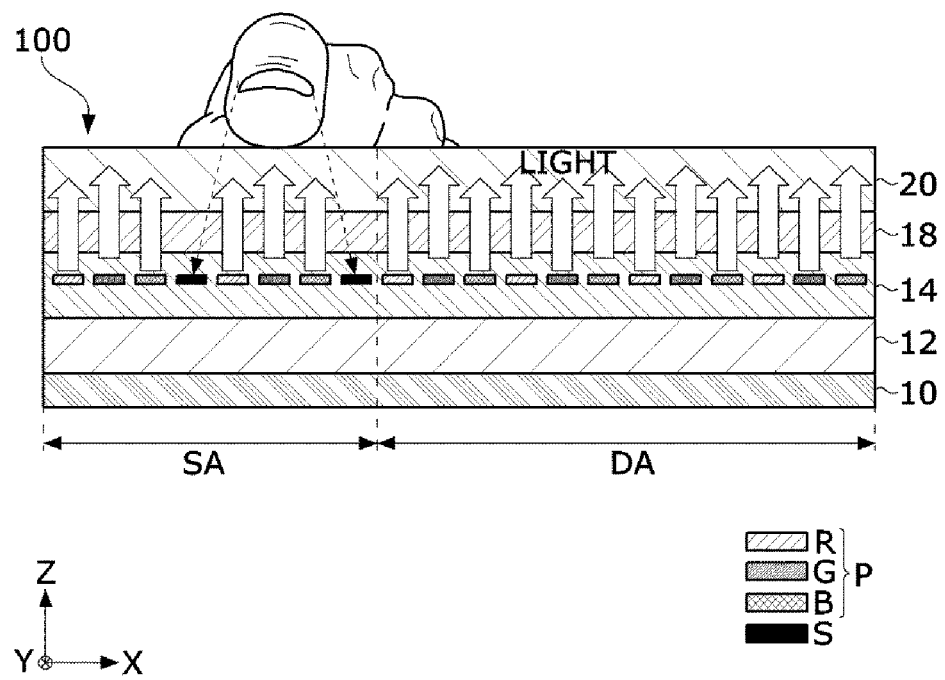
FIG. 1 is a diagram schematically showing a display device according to an aspect of the present disclosure.

The advantages and features of the present disclosure and methods for accomplishing the same will be more clearly understood from aspects described below with reference to the accompanying drawings. However, the present disclosure is not limited to the following aspects but may be implemented in various different forms. Rather, the present aspects will make the disclosure of the present disclosure complete and allow those skilled in the art to completely comprehend the scope of the present disclosure. The present disclosure is only defined within the scope of the accompanying claims.

The shapes, sizes, ratios, angles, numbers, and the like illustrated in the accompanying drawings for describing the aspects of the present disclosure are merely examples, and the present disclosure is not limited thereto. Like reference numerals generally denote like elements throughout the present specification. Further, in describing the present disclosure, detailed descriptions of known related technologies may be omitted to avoid unnecessarily obscuring the subject matter of the present disclosure.

The terms such as "comprising," "including," "having," and "consist of" used herein are generally intended to allow other components to be added unless the terms are used with the term "only." Any references to singular may include plural unless expressly stated otherwise.

Components are interpreted to include an ordinary error range even if not expressly stated.

When the position relation between two components is described using the terms such as "on," "above," "below," and "next," one or more components may be positioned between the two components unless the terms are used with the term "immediately" or "directly."

The terms "first," "second," and the like may be used to distinguish components from each other, but the functions or structures of the components are not limited by ordinal numbers or component names in front of the components.

The same reference numerals may refer to substantially the same elements throughout the present disclosure.

The following aspects can be partially or entirely bonded to or combined with each other and can be linked and operated in technically various ways. The aspects can be carried out independently of or in association with each other.

Hereinafter, various aspects of the present disclosure will be described in detail with reference to the accompanying drawings.

Figure 2:
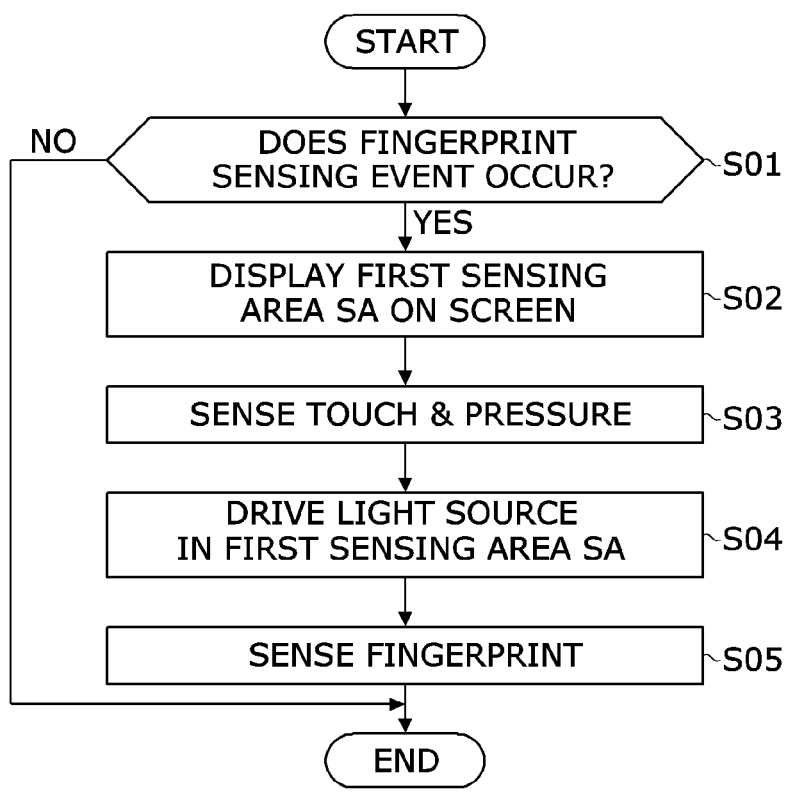
FIG. 2 is a flowchart illustrating a method of driving a sensing area in a fingerprint recognition mode according to an aspect of the present disclosure.

Referring to FIGS. 1 and 2, the screen of a display panel 100 includes a pixel array on which an input image is reproduced. The pixel array includes a display area DA and a sensing area SA.

A first group of display pixels R, G, and B to which pixel data is written are arranged in the display area DA. A second group of display pixels R, G, and B and a plurality of photosensors are arranged in the sensing area SA.

The display area DA includes the display pixels R, G, and B arranged in high pixels per inch (PPI) and displays input data. The input data may be pixel data of an input image or data including various types of information.

The sensing area SA includes the display pixels R, G, and B to which pixel data is written and pixels of an image sensor (hereinafter referred to as "sensor pixels") that sense a fingerprint pattern. The sensor pixels S include photosensors that photoelectrically convert light. The sensing area SA displays input data on the display pixels in a display mode, and senses a fingerprint using the sensor pixels in a fingerprint recognition mode. The sensor pixels S and the display pixels R, G, and B in the sensing area SA share most wires and have a similar cross-sectional structure. The display pixels R, G, and B and the sensor pixels S may be disposed on the same plane. In this case, a display pixel PPI in the sensing area SA may be lower than a display pixel PPI in the display area DA, due to a portion occupied by the sensor pixels S. The sensor pixels S and the display pixels R, G, and B in the sensing area SA may be simultaneously formed without a process added to a conventional manufacturing process.

Since the display pixel PPI in the sensing area SA is lower than that in the display area DA, an image quality compensation algorithm for compensating for luminance and color coordinates such that there is no difference in image quality in the display area DA with respect to the pixel data to be written into the display pixels of the sensing area SA may be applied.

In the present disclosure, the display pixels are provided not only in the display area DA, but also in the sensing area SA. Accordingly, a display device of the present disclosure may implement a full-screen display.

Each of the display pixels includes sub-pixels having different colors to reproduce colors in an image. The sub-pixels includes red sub-pixels (hereinafter referred to as "R sub-pixels"), green sub-pixels (hereinafter referred to as "G sub-pixels"), and blue sub-pixels (hereinafter referred to as "B sub-pixels"). Although not shown, each of the pixels P may further include white sub-pixels (hereinafter referred to as "W sub-pixels"). Each of the sub-pixels includes a pixel circuit and a light emitting element. In FIG. 1, R represents an R sub-pixel, G represents a G sub-pixel, and B represents a B sub-pixel.

At least one of the display pixels in the sensing area SA may be driven as a light source in the fingerprint recognition mode executed when a fingerprint recognition event occurs. In the fingerprint recognition mode, when a user places his/her fingerprint on a cover glass 20 of the sensing area SA, the light sources of the sensing area SA are turned on. The photosensor of each of the sensor pixels S in the sensing area SA is driven in the fingerprint recognition mode to convert light reflected from the user's fingerprint in contact with the cover glass 20 into an electric signal and transmit it to a fingerprint recognition processor. The fingerprint recognition processor amplifies the output signals from the photosensors and converts them into digital data to generate fingerprint pattern image data. A host system, which is omitted in FIG. 1, compares the fingerprint pattern image data from the fingerprint recognition processor with a previously registered user's fingerprint pattern to perform fingerprint authentication.

The fingerprint recognition processor may be integrated with a timing controller that controls an operation timing of a display panel driver.

In the present disclosure, since a separate fingerprint sensor module is not adhered to the display panel 100, there is no reduction in yield caused by the assembly process of the display panel and the fingerprint sensor module, and manufacturing cost may be lowered.

The display panel 100 has a width in an X-axis direction, a length in a Y-axis direction, and a thickness in a Z-axis direction. The display panel 100 includes a circuit layer 12 disposed on a substrate, and a light emitting element and sensor layer 14 disposed on the circuit layer 12. A polarizing plate 18 may be disposed on the light emitting element and sensor layer 14, and the cover glass 20 may be disposed on the polarizing plate 18.

The circuit layer 12 may include data lines, gate lines, a pixel circuit connected to power lines, a gate driver for driving the gate lines, a photosensor driving circuit, and the like. The circuit layer 12 may include circuit elements such as a transistor implemented as a thin film transistor (TFT) and a capacitor.

The light emitting element and sensor layer 14 may include a light emitting element driven by the pixel circuit. The light emitting element may be implemented as an OLED. The OLED includes an organic compound layer formed between an anode electrode and a cathode electrode. The organic compound layer may include a hole injection layer HIL, a hole transport layer HTL, an emission layer EML, an electron transport layer ETL, and an electron injection layer EIL, but is not limited thereto. When a voltage is applied to the anode and cathode electrodes of the OLED, holes that have passed through the hole transport layer HTL and electrons that have passed through the electron transport layer ETL move to the emission layer EML to form excitons, and as a result, visible light is emitted from the emission layer EML. The light emitting element and sensor layer 14 may further include a color filter disposed on the circuit layer 12 to selectively transmit red, green, and blue wavelengths.

The light emitting element and sensor layer 14 includes a photosensor formed on the same layer as the light emitting element. The photosensor may be implemented with an organic/inorganic photodiode.

The light emitting element and sensor layer 14 may be covered with a protective layer, and the protective layer may be covered with an encapsulation layer. The protective layer and the encapsulation layer may have a structure in which an organic film and an inorganic film are alternately stacked. The inorganic film blocks the penetration of moisture or oxygen. The organic film flattens the surface of the inorganic film. When the organic film and the inorganic film are stacked in multiple layers, the movement path of moisture or oxygen becomes longer than that in a single layer, so that the penetration of moisture/oxygen affecting the light emitting element and sensor layer 14 may be effectively blocked.

The polarizing plate 18 may be adhered to the encapsulation layer. The polarizing plate 18 improves outdoor visibility of the display device. The polarizing plate 18 reduces light reflected from the surface of the display panel 100 and blocks light reflected from the metal of the circuit layer 12 to improve brightness of the pixels. The polarizing plate 18 may be implemented as a polarizing plate in which a linear polarizing plate and a phase delay film are bonded, or a circular polarizing plate.

FIG. 2 is a flowchart illustrating a method of driving a sensing area SA in a fingerprint recognition mode according to an aspect of the present disclosure.

Referring to FIG. 2, when a fingerprint sensing event occurs, the sensing area SA starts to operate in the fingerprint recognition mode. The host system is connected to the display device and receives the fingerprint pattern image data from the fingerprint recognition processor to perform fingerprint authentication in an application that requires user authentication.

Figure 3:
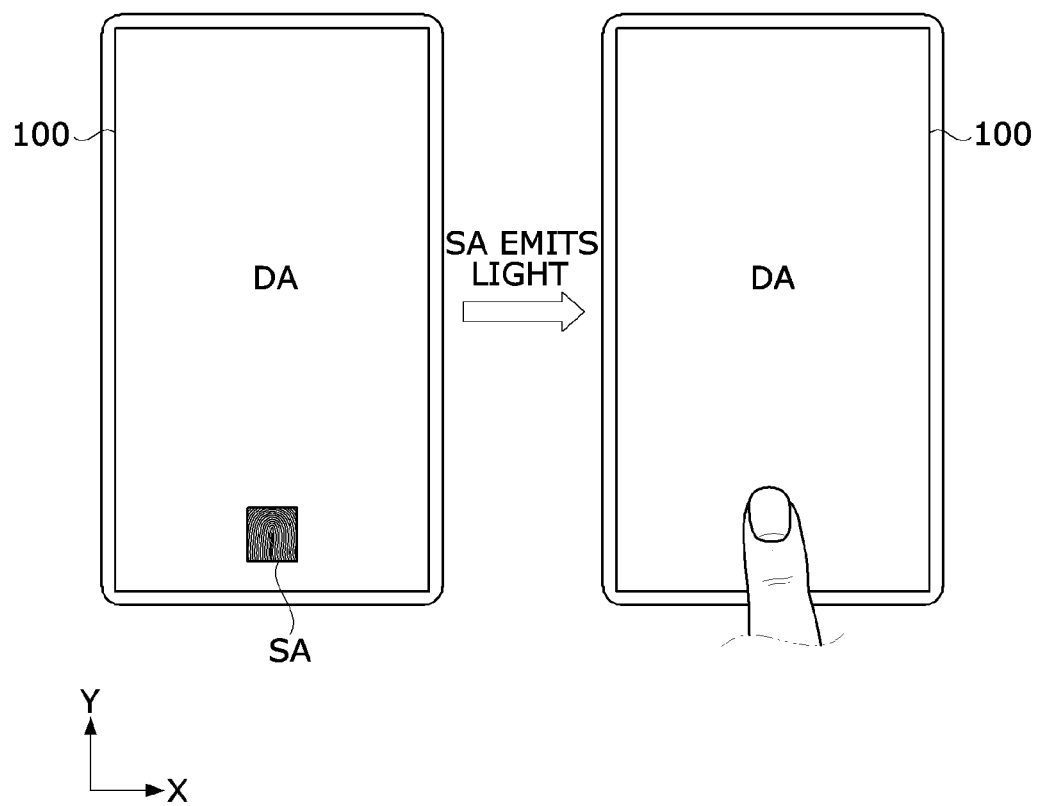
FIG. 3 is a diagram illustrating an example in which a fingerprint is sensed on a screen.

When the fingerprint recognition mode starts, the display device may, as shown in FIG. 3, display the sensing area SA on the screen to guide a fingerprint sensing position (steps S01 and S02). The host system detects a finger placed on the sensing area SA according to the output signal of a touch sensor or a pressure sensor (step S03). In response to a command from the host system, the fingerprint recognition processor drives the sensor pixels S and the light sources in the sensing area SA to sense the fingerprint (steps S04 and S05). The sensor pixels S perform photoelectric conversion on light reflected from the user's fingerprint in the fingerprint recognition mode. The fingerprint recognition processor converts the output signals of the sensor pixels S into digital data to generate the fingerprint pattern image data, and transmits the data to the host system.

Figure 4:
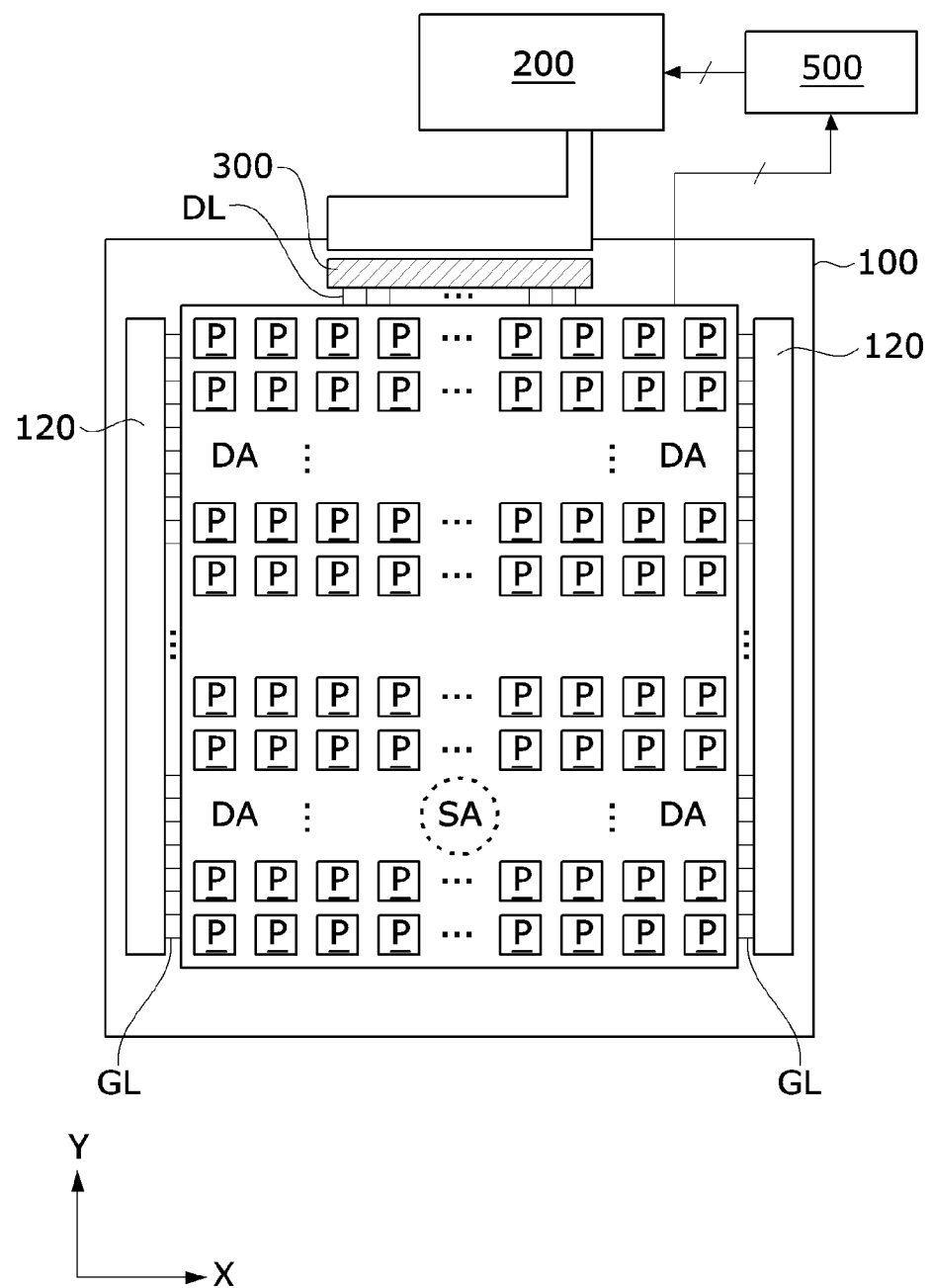
FIG. 4 is a block diagram illustrating a display panel and a display panel driver according to an aspect of the present disclosure.
Figure 5:
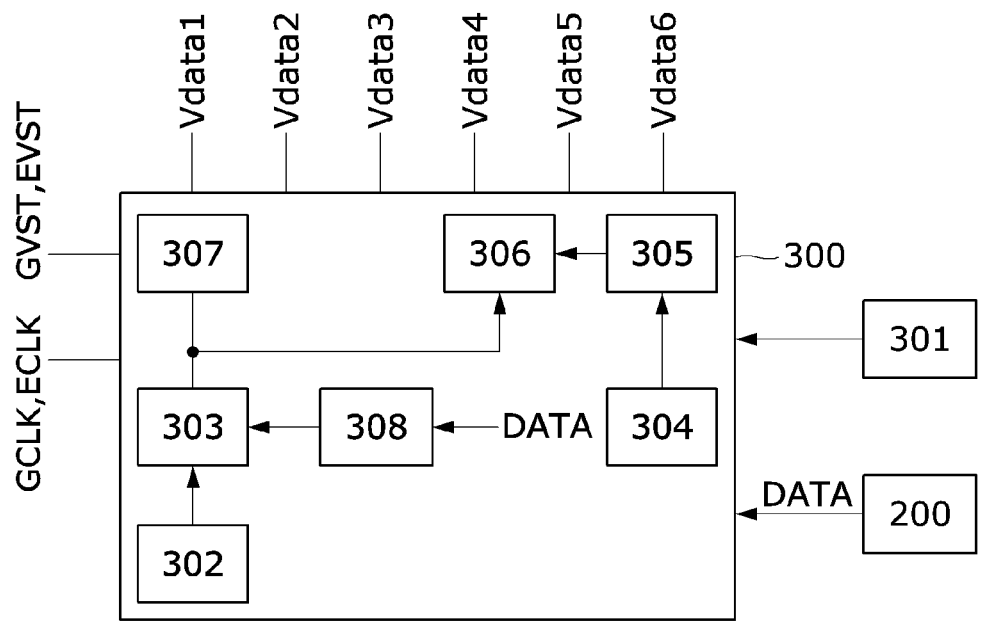
FIG. 5 is a block diagram schematically showing a configuration of a drive IC.

FIGS. 4 and 5 are diagrams showing a display device according to an aspect of the present disclosure.

Referring to FIGS. 4 and 5, the display device includes a display panel 100 in which a pixel array is arranged on the screen, a display panel driver, and the like.

The pixel array of the display panel 100 includes data lines DL, gate lines GL crossing the data lines DL, and display pixels P arranged in a matrix form defined by the data lines DL and the gate lines GL. The pixel array further includes power lines such as a VDD line PL1, a Vini line PL2, and a VSS line PL3 shown in FIGS. 6 and 7. The pixel array includes the display area DA and the sensing area SA which display an image together in the display mode. The sensing area SA senses a user's fingerprint pattern in the fingerprint recognition mode.

The pixel array may be divided into the circuit layer 12, the light emitting element and sensor layer 14 as shown in FIG. 1. A touch sensor array may be arranged on the light emitting element and sensor layer 14.

The screen on which an input image is reproduced in the display panel 100 includes the display area DA and the sensing area SA.

Each of the sub-pixels of the display pixel in the display area DA and the sensing area SA includes the pixel circuit. The pixel circuit may include a driving element that supplies a current to a light emitting element OLED, a plurality of switch elements that sample a threshold voltage of the driving element and switch a current path of the pixel circuit, and a capacitor that maintains the gate voltage of the driving element, and the like. Each of the sensor pixels S in the sensing area SA includes a photodiode and a photosensor driving circuit that drives the photodiode.

The sensing area SA includes pixels to which pixel data is written, and the sensor pixels S spaced apart at predetermined intervals with the above pixels interposed therebetween. The sensor pixels S include the photosensors and the photosensor driving circuit which drives the photosensors. While the display pixels in the sensing area SA emit light according to the data voltage of the pixel data to display input data in the display mode, they emit light with high luminance according to the voltage of light source driving data and thus are driven as light sources in the fingerprint recognition mode. The light source driving data is data irrelevant to the pixel data of the input image.

Figure 9:
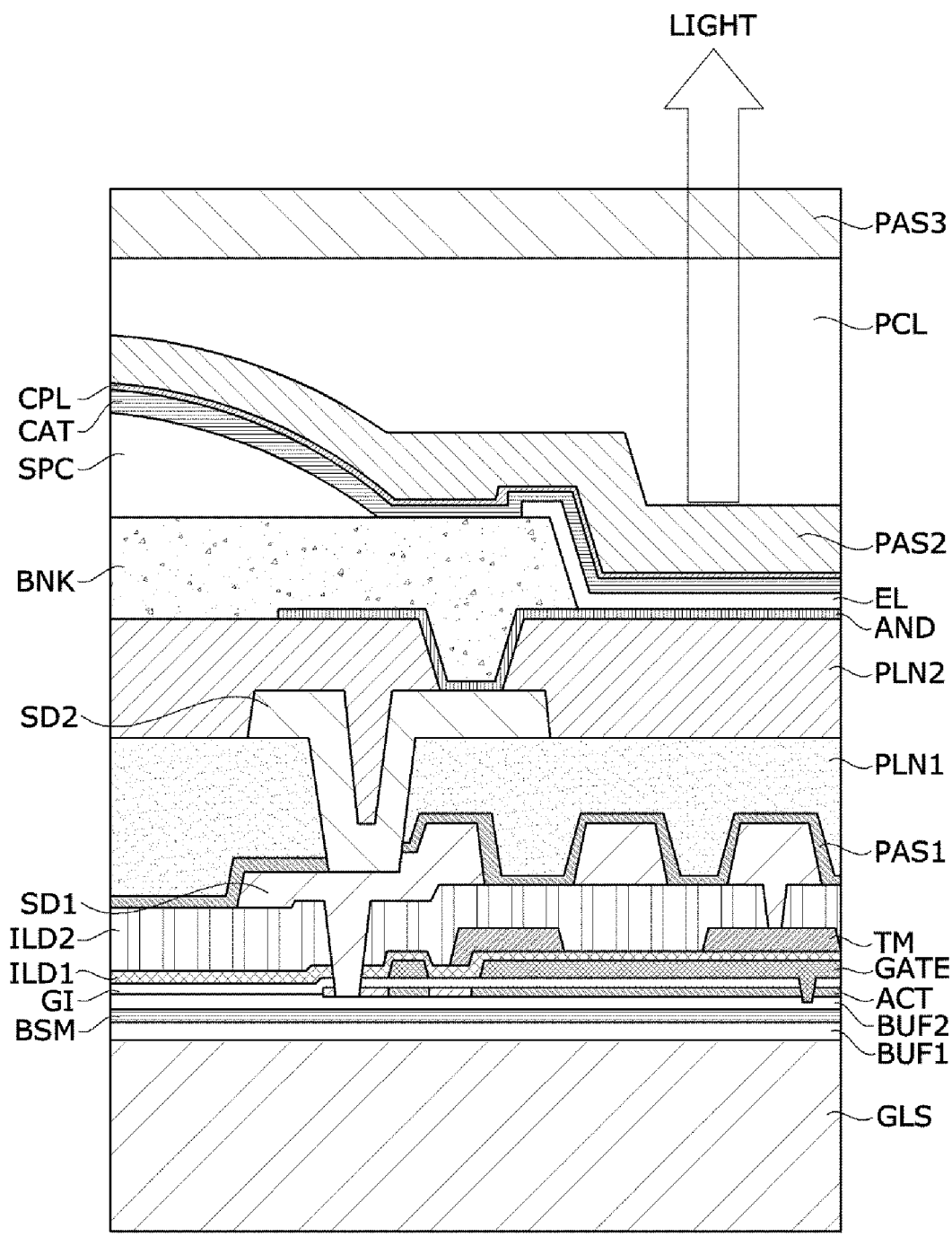
FIG. 9 is a cross-sectional view showing in detail a cross-sectional structure of a display panel according to an aspect of the present disclosure.
Figure 10:
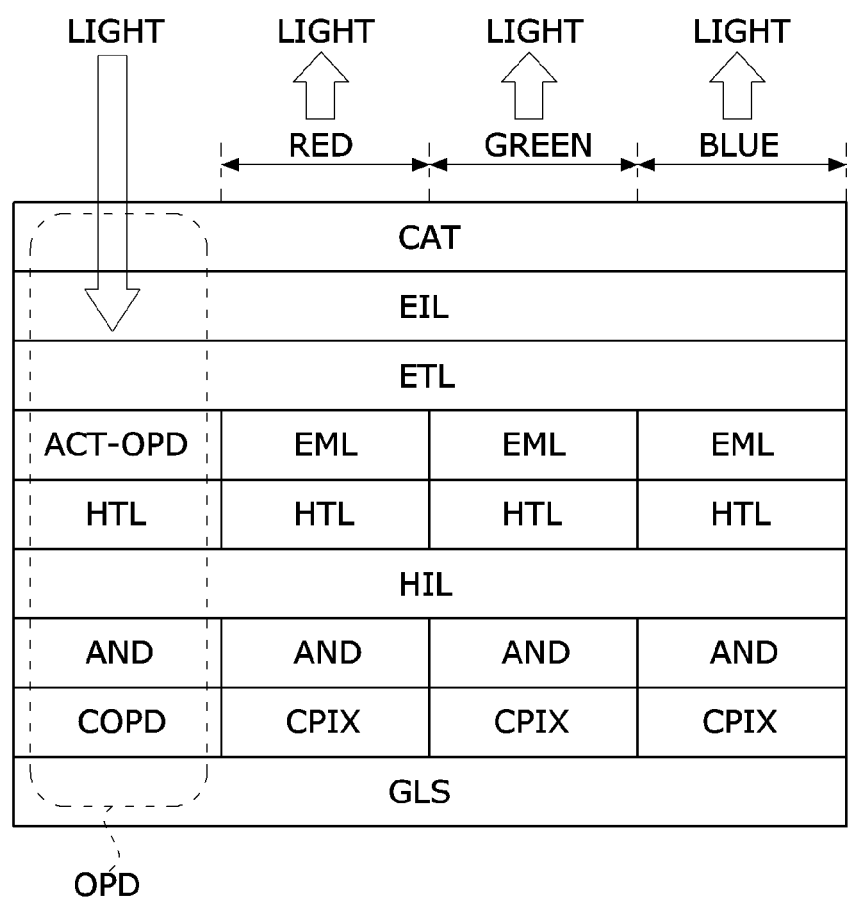
FIG. 10 is a diagram showing a cross-sectional structure of an organic photodiode of a sensor pixel and a light emitting element of a display pixel according to an aspect of the present disclosure.

The pixel circuit and the photosensor driving circuit may be disposed under the light emitting element OLED as shown in FIGS. 9 and 10.

The display panel driver writes the pixel data of the input image to the display pixels P. The display panel driver includes a data driver 306 that supplies a data voltage Vdata1 to Vdata6 of the pixel data DATA to the data lines DL, and a gate driver 120 that sequentially supplies a gate pulse to the gate lines GL. The data driver 306 may be integrated in a drive IC 300. The display panel driver may further include a touch sensor driver omitted from the drawing. The data driver 306 may be integrated in the drive IC 300 together with a timing controller 303.

The drive IC 300 may include a data receiving and operating unit 308, the timing controller 303, the data driver 306, a gamma compensation voltage generator 305, a power supply unit 304, a second memory 302, and the like. The drive IC 300 may be connected to a host system 200, a first memory 301, and the display panel 100.

The drive IC 300 may be adhered to the display panel 100. The drive IC 300 receives the pixel data of the input image and a timing signal from the host system 200, supplies the data voltage of the pixel data to the display pixels through the data lines DL, and synchronizes the data driver 306 with the gate driver 120.

The drive IC 300 is connected to the data lines DL through data output channels to supply the data voltage Vdata1 to Vdata6 of the pixel data DATA to the data lines DL. The drive IC 300 may output a gate timing signal for controlling the gate driver 120 through gate timing signal output channels. The gate timing signal generated from the timing controller 303 may include a gate start pulse VST, a gate shift clock CLK, and the like. The start pulse VST and the shift clock CLK swing between a gate-on voltage VGL and a gate-off voltage VGH. The gate timing signal VST and CLK outputted from a level shifter 307 is applied to the gate driver 120 to control the shift operation of the gate driver 120.

The gate driver 120 may include a shift register formed on the circuit layer of the display panel 100 together with the pixel array. The shift register of the gate driver 120 sequentially supplies a gate signal to the gate lines GL under the control of the timing controller 303. The gate signal includes a scan pulse and an EM pulse applied to the pixel circuit, and an exposure signal TG applied to the photosensor driving circuit. The shift register may include a scan driving unit that outputs the scan pulse and an EM driving unit that outputs the EM pulse. In FIG. 5, GVST and GCLK are gate timing signals inputted to the scan driving unit. EVST and ECLK are gate timing signals inputted to the EM driving unit.

The data receiving and operating unit 308 includes a receiving unit that receives the pixel data inputted as a digital signal from the host system 200 and a data operating unit that processes the pixel data inputted through the receiving unit to improve image quality. The data operating unit may include a data recovery unit that decodes and recover compressed pixel data, and an optical compensation unit that adds a preset optical compensation value to the pixel data. The optical compensation value may be set as a value for correcting the luminance of each pixel data based on the screen luminance measured by a camera image captured in the manufacturing process.

The timing controller 303 provides the pixel data of the input image received from the host system 200 to the data driver 306. The timing controller 303 generates the gate timing signal for controlling the gate driver 120 and a source timing signal for controlling the data driver 306 to control the operation timings of the gate driver 120 and the data driver 306.

The data driver 306 converts digital data including the pixel data received from the timing controller 303 into a gamma compensation voltage using a digital to analog converter (DAC) and outputs a data voltage. The data voltage outputted from the data driver 306 is supplied to the data lines DL of the pixel array through an output buffer connected to a data channel of the drive IC 300.

The gamma compensation voltage generator 305 divides a gamma reference voltage from the power supply unit 304 using a voltage divider circuit to generate the gamma compensation voltage for each grayscale. The gamma compensation voltage is an analog voltage in which a voltage is set for each grayscale of the pixel data. The gamma compensation voltage outputted from the gamma compensation voltage generator 305 is provided to the data driver 306.

The power supply unit 304 generates power required for driving the pixel array of the display panel 100, the gate driver 120, and the drive IC 300 using a DC-DC converter. The DC-DC converter may include a charge pump, a regulator, a buck converter, a boost converter, and the like. The power supply unit 304 may adjust a DC input voltage from the host system 200 to generate DC power such as the gamma reference voltage, the gate-on voltage VGL, the gate-off voltage VGH, a pixel driving voltage VDD, a low potential power voltage VSS, and an initialization voltage Vini. The gamma reference voltage is supplied to the gamma compensation voltage generator 305. The gate-on voltage VGL and the gate-off voltage VGH are supplied to the level shifter 307 and the gate driver 120. Pixel power such as the pixel driving voltage VDD, the low potential power voltage VSS, and the initialization voltage Vini is commonly supplied to the pixels P. The initialization voltage Vini is set to a DC voltage lower than the pixel driving voltage VDD and the threshold voltage of the light emitting element OLED to initialize main nodes of the pixel circuits and suppress the light emission of the light emitting element OLED.

The second memory 302 stores therein a compensation value, register setting data, and the like received from the first memory 301 when power is supplied to the drive IC 300. The compensation value may be applied to various algorithms for improving image quality. The compensation value may include an optical compensation value. The register setting data defines the operations of the data driver 306, the timing controller 303, the gamma compensation voltage generator 305, and the like. The first memory 301 may include a flash memory. The second memory 302 may include a static RAM (SRAM).

The host system 200 may be implemented with an application processor (AP). The host system 200 may transmit the pixel data of the input image to the drive IC 300 through a mobile industry processor interface (MIPI). The host system 200 may be connected to the drive IC 300 through, for example, a flexible printed circuit (FPC).

The present disclosure further includes a fingerprint recognition processor 500. The fingerprint recognition processor 500 is connected to the sensor pixels S of the sensing area SA. The fingerprint recognition processor 500 amplifies the output voltages of the photosensors S and then converts them into digital data using an analog-to-digital converter (ADC) to generate the fingerprint pattern image data. The host system 200 receives the fingerprint pattern image data from the fingerprint recognition processor 500 and processes fingerprint authentication in the fingerprint recognition mode.

The display panel 600 may be implemented as a flexible panel applicable to a flexible display. The flexible display may change the size of the screen by winding, folding, and bending the flexible panel, and may be easily manufactured in various designs. The flexible display may be implemented as a rollable display, a foldable display, a bendable display, a slidable display, or the like. The flexible panel may be manufactured with so-called "plastic OLED panel". The plastic OLED panel may include a back plate and a pixel array on an organic thin film bonded on the back plate. A touch sensor array may be formed on the pixel array.

The back plate may be a polyethylene terephthalate (PET) substrate. The pixel array and the touch sensor array may be formed on the organic thin film. The back plate may block moisture permeation toward the organic thin film so that the pixel array is not exposed to humidity. The organic thin film may be a polyimide (PI) film substrate. A multi-layered buffer film may be formed of an insulating material (not shown) on the organic thin film. The circuit layer 12 and the light emitting element and sensor layer 14 may be stacked on the organic thin film.

In the display device of the present disclosure, the pixel circuit, the photosensor driving circuit, the gate driver, and the like disposed in the circuit layer 12 may include a plurality of transistors. The transistor may be implemented as an oxide thin film transistor (TFT) including an oxide semiconductor, a low temperature poly silicon (LTPS) TFT including LTPS, or the like. Each of the transistors may be implemented as a p-channel TFT or an n-channel TFT. In an aspect, a description is made focusing on an example in which the transistors of the pixel circuit are implemented as p-channel TFTs, but the present disclosure is not limited thereto.

The transistor is a three-electrode element including a gate, a source, and a drain. The source is an electrode that supplies carriers to the transistor. In the transistor, the carriers start flowing from the source. The drain is an electrode through which the carriers exit from the transistor. In the transistor, the carriers flows from the source to the drain. In the case of an n-channel transistor, since the carriers are electrons, a source voltage is lower than a drain voltage so that the electrons can flow from the source to the drain. In the n-channel transistor, a current flows from the drain to the source. In the case of a p-channel transistor (PMOS), since the carriers are holes, the source voltage is higher than the drain voltage so that the holes can flow from the source to the drain. In the p-channel transistor, since the holes flow from the source to the drain, a current flows from the source to the drain. It should be noted that the source and drain of the transistor are not fixed. For example, the source and the drain may be changed according to an applied voltage. Therefore, the present disclosure is not limited due to the source and drain of the transistor. In the following description, the source and drain of the transistor will be referred to as first and second electrodes.

The gate pulse swings between the gate-on voltage and the gate-off voltage. The gate-on voltage is set to a voltage higher than the threshold voltage of the transistor, and the gate-off voltage is set to a voltage lower than the threshold voltage of the transistor. The transistor is turned on in response to the gate-on voltage, while it is turned off in response to the gate-off voltage. In the case of the n-channel transistor, the gate-on voltage may be a gate high voltage VGH, and the gate-off voltage may be a gate low voltage VGL. In the case of the p-channel transistor, the gate-on voltage may be the gate low voltage VGL, and the gate-off voltage may be the gate high voltage VGH.

The driving element of the pixel circuit may be implemented with a transistor. The electrical properties of the driving element needs to be uniform among all pixels, but the electrical properties may differ between pixels due to process deviation and element properties deviation, and may change over the lapse of driving time of the display. In order to compensate for such a deviation in the electrical properties of the driving element, the display device may include an internal compensation circuit and an external compensation circuit. The internal compensation circuit is added to the pixel circuit in each of the sub-pixels and samples a threshold voltage Vth and/or a mobility μ of the driving element, which varies depending on the electrical properties of the driving element, and compensates the variation in real time. The external compensation circuit transmits the threshold voltage and/or mobility of the driving element sensed through a sensing line connected to each of the sub-pixels to an external compensation unit. The compensation unit of the external compensation circuit reflects the sensed result to modulate the pixel data of the input image, thereby compensating for the variation in the electrical properties of the driving element. A pixel voltage that varies depending on electrical properties of an external compensation driving element is sensed, and the data of the input image is modulated in an external circuit based on the sensed voltage, thereby compensating for a deviation in the electrical properties of the driving element between pixels.

Figure 6:
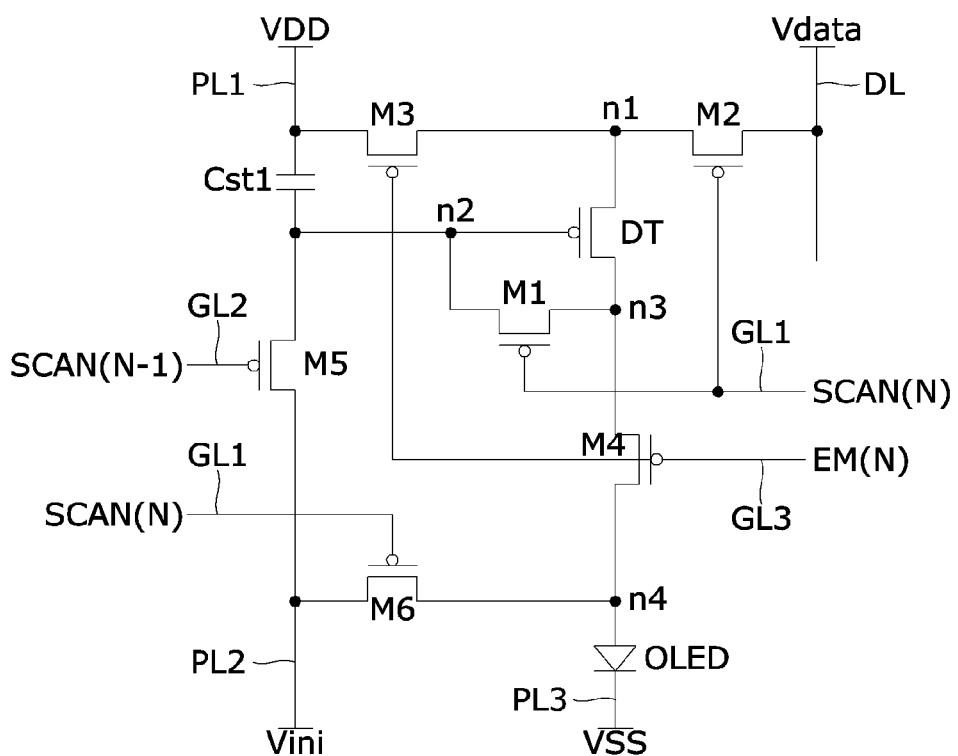
FIG. 6 is a circuit diagram showing an example of a pixel circuit.
Figure 7:
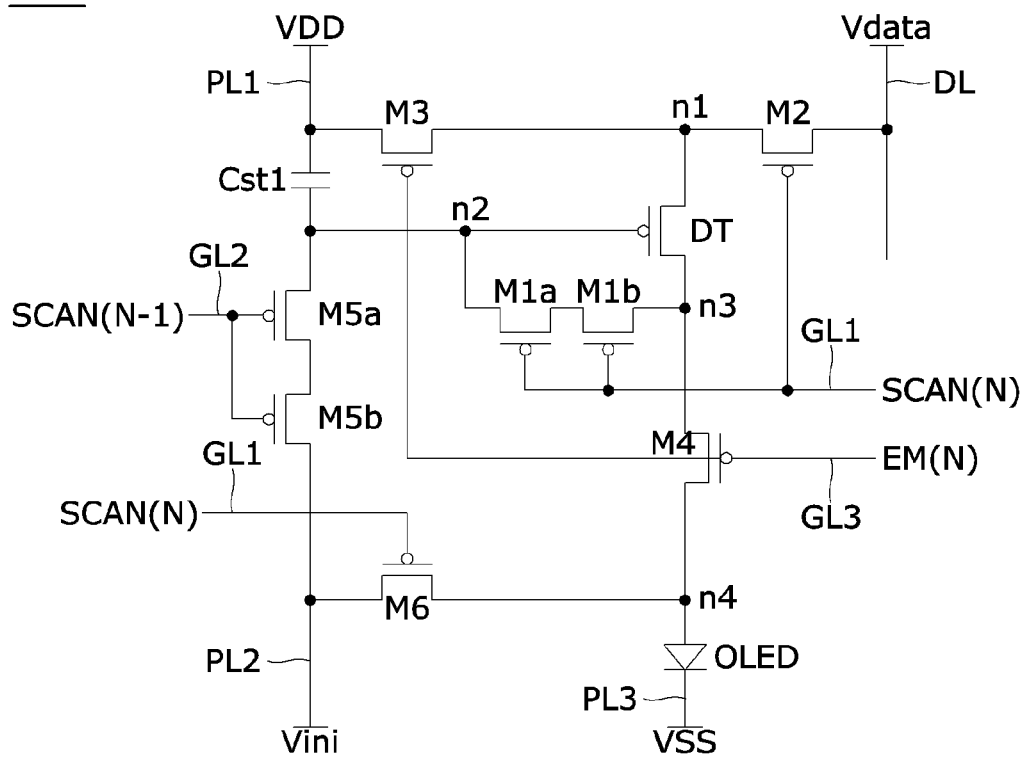
FIG. 7 is a circuit diagram showing another example of a pixel circuit.
Figure 8:
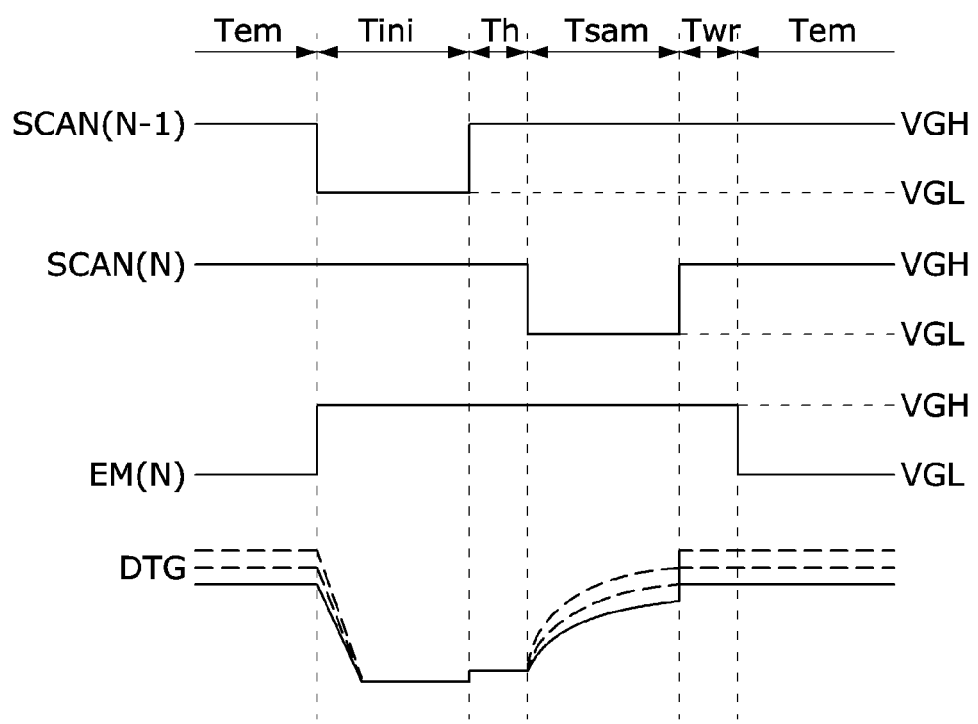
FIG. 8 is a waveform diagram showing a method of driving the pixel circuits shown in FIGS. 6 and 7.

FIGS. 6 and 7 are circuit diagrams showing an example of a pixel circuit to which an internal compensation circuit is applied. FIG. 8 is a diagram illustrating a method of driving the pixel circuits shown in FIGS. 6 and 7. It should be noted that the pixel circuit of the present disclosure is not limited to those shown in FIGS. 6 to 8. The pixel circuits shown in FIGS. 6 and 7 may be equally applied to the display pixels in the display area DA and the sensing area SA.

Referring FIGS. 6 to 8, the pixel circuit includes a light emitting element OLED, a driving element DT for supplying a current to the light emitting element OLED, and a switch circuit for switching voltages applied to the electrodes of the driving element DT in response to scan pulses SCAN(N−1) and SCAN(N).

The switch circuit is connected to power lines PL1, PL2, and PL3 to which the pixel driving voltage VDD, the low potential power voltage VSS, and the initialization voltage Vini are applied, a data line DL, and gate lines GL1, GL2, and GL3.

The switch circuit samples the threshold voltage Vth of the driving element DT using a plurality of switch elements M1 to M6 and stores it in a capacitor Cst1, and compensates the gate voltage of the driving element DT by the threshold voltage Vth of the driving element DT. Each of the driving element DT and the switch elements M1 to M6 may be implemented with a p-channel TFT.

The driving period of the pixel circuit using the internal compensation circuit may, as shown in FIG. 8, be divided into an initialization period Tini, a sampling period Tsam, a data writing period Twr, and a light emission period Tem.

An $N^{th}$ scan pulse SCAN(N) is generated as the gate-on voltage VGL during the sampling period Tsam and is applied to a first gate line GL1. An $(N-1)^{th}$ scan pulse SCAN(N−1) is generated as the gate-on voltage VGL during the initialization period Tini prior to the sampling period and is applied to a second gate line GL2. An EM pulse EM(N) is generated as the gate-off voltage VGH during the initialization period Tini and the sampling period Tsam, and is applied to a third gate line GL3. The EM pulse EM(N) may be generated as the gate-off voltage during the data writing period Twr.

During the initialization period Tini, the $(N-1)^{th}$ scan pulse SCAN(N−1) is generated as the gate-on voltage VGL, and the voltage of each of the $N^{th}$ scan pulse SCAN(N) and the EM pulse EM(N) is the gate-off voltage VGH. During the sampling period Tsam, the $N^{th}$ scan pulse SCAN(N) is generated as the pulse of the gate-on voltage VGL, and the voltage of each of the $(N-1)^{th}$ scan pulse SCAN(N−1) and the EM pulse EM(N) is the gate-off voltage VGH. During the data writing period Twr, the voltage of each of the $(N-1)^{th}$ scan pulse SCAN(N−1), the $N^{th}$ scan pulse SCAN(N), and the EM pulse EM(N) is the gate-off voltage VGH. The EM pulse EM(N) is generated as the gate-on voltage VGL during at least a part of the light emission period Tem, and the voltage of each of the $(N-1)^{th}$ scan pulse SCAN(N−1) and the $N^{th}$ scan pulse SCAN(N) is the gate-off voltage VGH.

During the initialization period Tini, a fifth switch element M5 is turned on in response to the gate-on voltage VGL of the $(N-1)^{th}$ scan pulse SCAN(N−1) to initialize the pixel circuit. During the sampling period Tsam, first and second switch elements M1 and M2 are turned on in response to the gate-on voltage VGL of the $N^{th}$ scan pulse SCAN(N), so that a data voltage Vdata compensated by the threshold voltage of the driving element DT is stored in the capacitor Cst1. At the same time, a sixth switch element M6 is turned on during the sampling period Tsam to lower the voltage of a fourth node n4 to a reference voltage Vref, thereby suppressing light emission of the light emitting element OLED. During the data writing period Twr, the first to sixth switch elements M1 to M6 are maintained in the off state.

During the light emission period Tem, third and fourth switch elements M3 and M4 are turned on, so that the light emitting element OLED emits light. In the light emission period Tem, in order to accurately express the luminance of low grayscale with the duty ratio of the EM pulse EM(N), the EM pulse EM(N) may swing at a predetermined duty ratio between the gate-on voltage VGL and the gate-off voltage VGH, so that the third and fourth switch elements M3 and M4 are repeatedly turned on/off.

The light emitting element OLED may be implemented with an organic light emitting diode or an inorganic light emitting diode. Hereinafter, an example in which the light emitting element OLED is implemented with the organic light emitting diode will be described.

The anode electrode of the light emitting element OLED is connected to the fourth node n4 between the fourth and sixth switch elements M4 and M6. The fourth node n4 is connected to the anode of the light emitting element OLED, the second electrode of the fourth switch element M4, and the second electrode of the sixth switch element M6. The cathode electrode of the light emitting element OLED is connected to the VSS line PL3 to which the low potential power voltage VSS is applied. The light emitting element OLED emits light by a current Ids flowing according to a gate-source voltage Vgs of the driving element DT. The current path of the light emitting element OLED is switched by the third and fourth switch elements M3 and M4.

The storage capacitor Cst1 is connected between the VDD line PL1 and a second node n2. The data voltage Vdata compensated by the threshold voltage Vth of the driving element DT is charged in the storage capacitor Cst1. Since the data voltage Vdata is compensated by the threshold voltage Vth of the driving element DT in each of the sub-pixels, deviation in the properties of the driving element DT is compensated in the sub-pixels.

The first switch element M1 is turned on in response to the gate-on voltage VGL of the $N^{th}$ scan pulse SCAN(N) to connect the second node n2 to a third node n3. The second node n2 is connected to the gate electrode of the driving element DT, the first electrode of the storage capacitor Cst1, and the first electrode of the first switch element M1. The third node n3 is connected to the second electrode of the driving element DT, the second electrode of the first switch element M1, and the first electrode of the fourth switch element M4. The gate electrode of the first switch element M1 is connected to the first gate line GL1 to receive the $N^{th}$ scan pulse SCAN(N). The first electrode of the first switch element M1 is connected to the second node n2, and the second electrode of the first switch element M1 is connected to the third node n3.

Since the first switch element M1 is turned on only for one horizontal period 1H, which is very short, in which the $N^{th}$ scan pulse SCAN(N) is generated as the gate-on voltage VGL in one frame period, and thus is maintained in the off state for approximately one frame period, a leakage current may occur in the off state of the first switch element M1. In order to suppress the leakage current in the first switch element M1, the first switch element M1 may be implemented, as shown in FIG. 7, with a transistor having a dual gate structure in which two transistors M1$a$ and M1$b$ are connected in series.

The second switch element M2 is turned on in response to the gate-on voltage VGL of the $N^{th}$ scan pulse SCAN(N) to supply the data voltage Vdata to a first node n1. The gate electrode of the second switch element M2 is connected to the first gate line GL1 to receive the $N^{th}$ scan pulse SCAN(N). The first electrode of the second switch element M2 is connected to the first node n1. The second electrode of the second switch element M2 is connected to the data line DL to which the data voltage Vdata is applied. The first node n1 is connected to the first electrode of the second switch element M2, the second electrode of the third switch element M3, and the first electrode of the driving element DT.

The third switch element M3 is turned on in response to the gate-on voltage VGL of the EM pulse EM(N) to connect the VDD line PL1 to the first node n1. The gate electrode of the third switch element M3 is connected to the third gate line GL3 to receive the EM pulse EM(N). The first electrode of the third switch element M3 is connected to the VDD line PL1. The second electrode of the third switch element M3 is connected to the first node n1.

The fourth switch element M4 is turned on in response to the gate-on voltage VGL of the EM pulse EM(N) to connect the third node n3 to the anode electrode of the light emitting element OLED. The gate electrode of the fourth switch element M4 is connected to the third gate line GL3 to receive the EM pulse EM(N). The first electrode of the fourth switch element M4 is connected to the third node n3, and the second electrode thereof is connected to the fourth node n4.

The fifth switch element M5 is turned on in response to the gate-on voltage VGL of the $(N-1)^{th}$ scan pulse SCAN(N-1) to connect the second node n2 to the Vini line PL2. The gate electrode of the fifth switch element M5 is connected to the second gate line GL2 to receive the $(N-1)^{th}$ scan pulse SCAN(N-1). The first electrode of the fifth switch element M5 is connected to the second node n2, and the second electrode thereof is connected to the Vini line PL2. In order to suppress a leakage current in the fifth switch element M5, the fifth switch element M5 is implemented, as shown in FIG. 7, with a transistor having a dual gate structure in which two transistors M5a and M5b are connected in series.

The sixth switch element M6 is turned on in response to the gate-on voltage VGL of the $N^{th}$ scan pulse SCAN(N) to connect the Vini line PL2 to the fourth node n4. The gate electrode of the sixth switch element M6 is connected to the first gate line GL1 to receive the $N^{th}$ scan pulse SCAN(N). The first electrode of the sixth switch element M6 is connected to the Vini line PL2, and the second electrode thereof is connected to the fourth node n4.

The driving element DT drives the light emitting element OLED by controlling the current Ids flowing through the light emitting element OLED according to the gate-source voltage Vgs. The driving element DT includes a gate connected to the second node n2, a first electrode connected to the first node n1, and a second electrode connected to the third node n3.

During the initialization period Tini, the $(N-1)^{th}$ scan pulse SCAN(N-1) is generated as the gate-on voltage VGL. The $N^{th}$ scan pulse SCAN(N) and the EM pulse EM(N) maintain the gate-off voltage VGH during the initialization period Tini. Accordingly, during the initialization period Tini, the fifth switch element M5 is turned on, so that the second and fourth nodes n2 and n4 are initialized to Vini. A hold period Th may be set between the initialization period Tini and the sampling period Tsam. During the hold period Th, the gate pulses SCAN(N-1), SCAN(N), and EM(N) maintain their previous states.

During the sampling period Tsam, the $N^{th}$ scan pulse SCAN(N) is generated as the gate-on voltage VGL. The pulse of the $N^{th}$ scan pulse SCAN(N) is synchronized with the data voltage Vdata of a $N^{th}$ pixel line. The $(N-1)^{th}$ scan pulse SCAN(N-1) and the EM pulse EM(N) maintain the gate-off voltage VGH during the sampling period Tsam. Accordingly, the first and second switch elements M1 and M2 are turned on during the sampling period Tsam.

During the sampling period Tsam, a gate voltage DTG of the driving element DT rises due to a current flowing through the first and second switch elements M1 and M2. When the driving element DT is turned off, the gate voltage DTG is Vdata−|Vth|. In this case, the voltage of the first node n1 is also Vdata−|Vth|. During the sampling period Tsam, the gate-source voltage Vgs of the driving element DT is expressed as |Vgs|=Vdata−(Vdata−|Vth|)=|Vth|.

During the data writing period Twr, the $N^{th}$ scan pulse SCAN(N) is inverted to the gate-off voltage VGH. The $(N-1)^{th}$ scan pulse SCAN(N-1) and the EM pulse EM(N) maintain the gate-off voltage VGH during the data writing period Twr. Accordingly, all of the switch elements M1 to M6 are maintained in the off state during the data writing period Twr.

During the light emission period Tem, the EM pulse EM(N) may be generated as the gate-on voltage VGL. During the light emission period Tem, in order to improve the low grayscale expression, the EM pulse EM(N) may be turned on/off at a predetermined duty ratio to swing between the gate-on voltage VGL and the gate-off voltage VGH. Accordingly, the EM pulse EM(N) may be generated as the gate-on voltage VGL during at least a part of the light emission period Tem.

When the EM pulse EM(N) is the gate-on voltage VGL, a current flows between VDD and the light emitting element OLED, so that the light emitting element OLED may emit light. During the light emission period Tem, the $(N-1)^{th}$ and $N^{th}$ scan pulses SCAN(N-1) and SCAN(N) maintain the gate-off voltage VGH. During the light emission period Tem, the third and fourth switch elements M3 and M4 are repeatedly turned on/off according to the voltage of the EM pulse EM(N). When the EM pulse EM(N) is the gate-on voltage VGL, the third and fourth switch elements M3 and M4 are turned on, so that a current flows through the light emitting element OLED. At this time, Vgs of the driving element DT is expressed as |Vgs|=VDD−(Vdata−|Vth|), and the current flowing through the light emitting element OLED is $K(VDD-Vdata)^2$. K is a constant value determined by charge mobility, parasitic capacitance, channel capacity, and the like of the driving element DT.

FIG. 9 is a cross-sectional view showing in detail a cross-sectional structure of a display panel according to an aspect of the present disclosure. It should be noted that the cross-sectional structure of the display panel 100 is not limited to that shown in FIG. 9.

Referring to FIG. 9, the circuit layer, the light emitting element and sensor layer, the encapsulation layer, and the like may be stacked on a substrate GLS.

A first buffer layer BUF1 may be formed on the substrate GLS. A first metal layer M01 may be formed on the first buffer layer BUF1, and a second buffer layer BUF2 may be formed on the first metal layer M01. The first metal layer is patterned in a photolithography process. The first metal layer may include a light shield pattern BSM. The light shield pattern BSM blocks external light so that light is not irradiated to the active layer of the TFT. Each of the first and second buffer layers BUF1 and BUF2 may be formed of an inorganic insulating material and may be formed of one or more insulating layers.

An active layer ACT may be formed of a semiconductor material, for example, a-Si, deposited on the second buffer layer BUF2 and may be patterned by the photolithography process. The active layer ACT includes active patterns of the TFTs of the pixel circuit and the TFT of the gate driver. The active layer ACT may be partially metallized by ion doping. The metallized portion may be used as a jumper pattern, which connects metal layers at some nodes of the pixel circuit, to connect components of the pixel circuit.

A gate insulating layer GI may be formed on the active layer ACT. The gate insulating layer GI may be made of an inorganic insulating material. A second metal layer may be formed on the second gate insulating layer GI. The second metal layer may be patterned by the photolithography process. The second metal layer may include a gate line and a gate electrode pattern GATE, a lower electrode of the storage capacitor Cst1, a jumper pattern connecting the patterns of the first metal layer and a third metal layer, and the like.

A first interlayer insulating layer ILD1 may cover the second metal layer. The third metal layer may be formed on the first interlayer insulating layer ILD1, and a second interlayer insulating layer ILD2 may cover the third metal layer. The third metal layer may be patterned by the photolithography process. The third metal layer may include metal patterns TM such as an upper electrode of the storage capacitor Cst1 and a power line. The first and second interlayer insulating layers ILD1 and ILD2 may include inorganic insulating materials.

A fourth metal layer may be formed on the second interlayer insulating layer ILD2, and an inorganic insulating layer PAS1 and a first planarization layer PLN1 may be stacked thereon. A fifth metal layer may be formed on the first planarization layer PLN1.

Some patterns of the fourth metal layer may be connected to the third metal layer through a contact hole penetrating the first planarization layer PLN1 and the inorganic insulating layer PAS1. The first and second planarization layers PLN1 and PLN2 may be made of organic insulating materials that flatten the surface.

The fourth metal layer may include the first and second electrodes of the TFT connected to the active pattern of the TFT through a contact hole penetrating the second interlayer insulating layer ILD2. The data line DL and the power lines PL1, PL2, and PL3 may be implemented in a pattern SD1 of the fourth metal layer or a pattern SD2 of the fifth metal layer.

An anode electrode AND of the light emitting element OLED may be formed on the second planarization layer PLN2. The anode electrode AND may be connected to the electrode of the TFT used as the switch element or the driving element through a contact hole penetrating the second planarization layer PLN2. The anode electrode AND may be made of a transparent or translucent electrode material.

A pixel defining layer BNK may cover the anode electrode AND of the light emitting element OLED. The pixel defining layer BNK is formed in a pattern defining an emission area (or an opening area) through which light passes from each of the pixels to the outside. A spacer SPC may be formed on the pixel defining layer BNK. The pixel defining layer BNK and the spacer SPC may be integrally formed of the same organic insulating material. The spacer SPC secures a gap between a fine metal mask (FMM) and the anode electrode AND so that the FMM is not brought into contact with the anode electrode AND in a deposition process of an organic compound layer EL.

The organic compound layer EL is formed in the emission area of each of the pixels defined by the pixel defining layer BNK. A cathode electrode CAT of the light emitting element OLED is formed on the entire surface of the display panel 100 to cover the pixel defining layer BNK, the spacer SPC, and the organic compound layer EL. The cathode electrode CAT may be connected to the VSS line PL3 formed of any one of the metal layers therebelow. A capping layer CPL may cover the cathode electrode CAT. The capping layer CPL may be made of inorganic insulating material and may block the penetration of air and out-gassing of an organic insulating material applied on the capping layer CPL to protect the cathode electrode CAT. An inorganic insulating layer PAS2 may cover the capping layer CPL, and a planarization layer PCL may be formed on the inorganic insulating layer PAS2. The planarization layer PCL may include an organic insulating material. An inorganic insulating layer PAS3 of the encapsulation layer may be formed on the planarization layer PCL.

The photodiodes of the sensor pixels S may be implemented as organic photodiodes. As illustrated in FIG. 10, an active layer ACT-OPD of an organic photodiode OPD may be formed on the same plane as the organic compound layer EL of the display pixel.

The circuit layer of the sensing area SA is implemented in a structure similar to that of the pixel circuit and may share wires connected to the pixel circuit. Accordingly, the photosensor driving circuit may be implemented in a structure that shares at least a part thereof with the pixel circuit.

FIG. 10 is a diagram showing a cross-sectional structure of an organic photodiode of a sensor pixel S and a light emitting element OLED of a display pixel according to an aspect of the present disclosure.

Referring to FIG. 10, the photodiode may be implemented as the organic photodiode OPD. The organic photodiode OPD may be implemented in substantially the same structure as the light emitting element OLED.

The light emitting element OLED includes the anode electrode AND, the hole injection layer HIL, the hole transport layer HTL, the light emitting layer EML, the electron transport layer ETL, the electron injection layer EIL, and the cathode electrode CAT which are stacked on a pixel circuit CPIX. The hole injection layer HIL is in contact with the anode electrode AND of the light emitting element OLED, and the electron injection layer EIL is in contact with the cathode electrode CAT thereof.

The organic photodiode OPD includes the anode electrode AND, the hole injection layer HIL, the hole transport layer HTL, the active layer ACT-OPD, the electron transport layer ETL, the electron injection layer EIL, and the cathode electrode CAT which are stacked on a photosensor driving circuit COPD. The active layer ACT-OPD of the organic photodiode includes a known organic semiconductor material.

The low potential power voltage VSS and the pixel driving voltage VDD are applied to the pixel circuit CPIX and the photosensor driving circuit COPD. The cathode electrode CAT of the light emitting element OLED and the cathode electrode CAT of the organic photodiode OPD share the same metal electrode and are commonly connected to the VSS line. The anode electrode AND of the light emitting element OLED and the anode electrode AND of the organic photodiode OPD may be divided into a metal pattern formed on the same layer. The anode electrode AND of the light emitting element OLED and the anode electrode AND of the organic photodiode OPD are electrically separated.

The active layer ACT-OPD of the organic photodiode OPD may be formed of an organic semiconductor material, which can be coated by a solution process, for example, a compound made of one or more organic materials selected from the group consisting of P3HT:PC61BM Squaraine:PC61BM, C60, PBDTTT-C:PC71BM, PDPP3T:PC71BM, PCDTBT:PC61BM, PVK:PC71BM, PCDTBT:PC71BM, ZnO:F8T2, PBDT-TFTTE:PC71BM, P3HT:PC61BM, TAPC:C60, P3HT:PC60BM, PFBT2OBT:PC71BM, PIDT-TPD:PC61BM, P3HT:PC71BM, PV-D4650:PC61BM, P3HT:O-IDTBR, and 2,9-dimethylquinacridone (2,9-DMQA), but is not limited thereto. Since the organic semiconductor material may be subjected to a solution process at a relatively low temperature compared to an inorganic semiconductor material formed in a high-temperature deposition process, it can be applied to a flexible display and the manufacturing cost can be reduced.

As can be seen in FIG. 10, the organic photodiode OPD has substantially the same cross-sectional structure as the light emitting element OLED, and most of the layers may be formed of the same material as the light emitting element OLED. The organic photodiode OPD and the light emitting element OLED may be shared, and they may share the power lines and the gate lines. Accordingly, since the light emitting element OLED and the organic photodiode OPD may be formed in the same manufacturing process and have the same cross-sectional structure, they may share most of circuit components, thereby simplifying the structure of the display panel.

Figure 11:
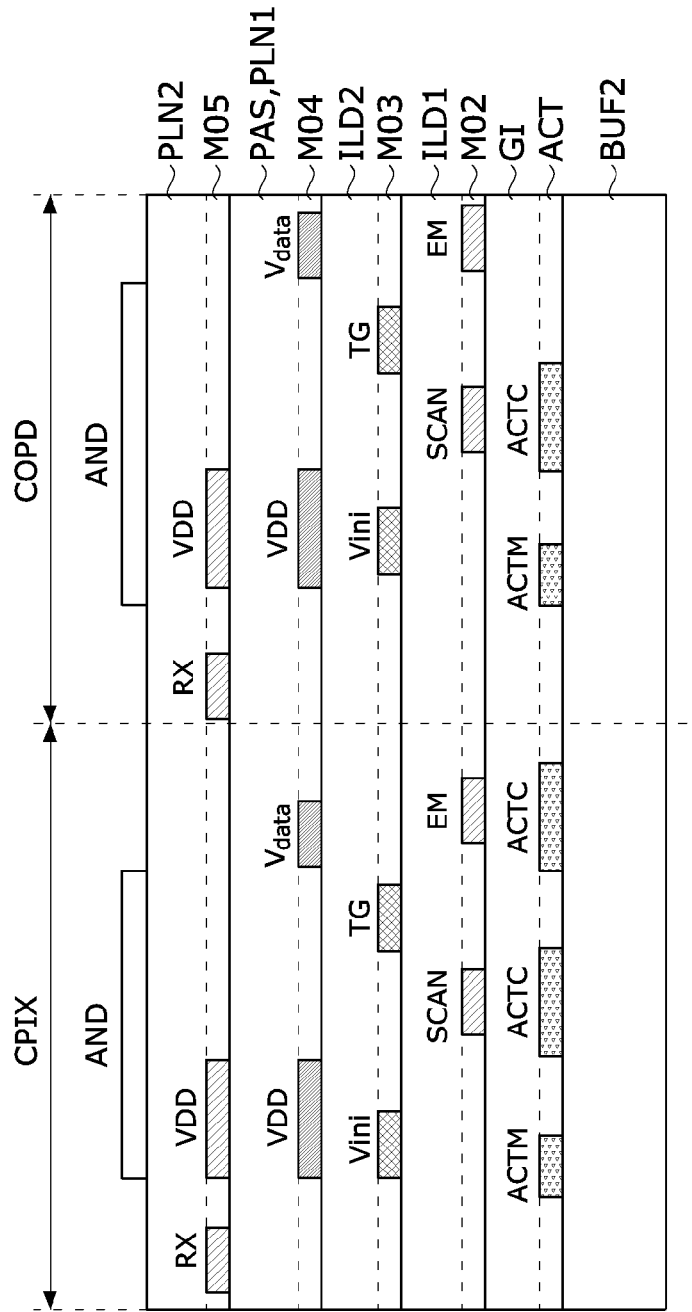
FIG. 11 is a diagram showing metal layers of a pixel circuit and a photosensor driving circuit.

FIG. 11 is a diagram showing metal layers of a pixel circuit CPIX and a photosensor driving circuit COPD. In FIG. 11, the first metal layer is omitted. The cross-sectional structure of the pixel circuit CPIX and the photosensor driving circuit COPD is not limited to that shown in FIG. 11. In FIG. 11, GI, ILD1, ILD2, PAS, PLN1, and PLN2 are insulating layers that insulate between the active layer ACT and a second metal layer M02, and between metal layers.

Referring to FIG. 11, the active layer ACT includes a semiconductor pattern ACTC having a semiconductor pattern ACTM partially metallized by ion doping. The semiconductor pattern ACTC includes an active pattern of each of the TFTs in the pixel circuit CPIX and the photosensor driving circuit COPD.

The second metal layer M02 may be patterned into the gate lines to which the scan pulse and the EM pulse are applied. A third metal layer M03 may be patterned into the Vini line PL2 to which Vini is applied and the gate line to which the exposure signal TG is applied. A fourth metal layer M04 may be patterned into a data line to which the data voltage VDATA is applied, and the like. A fifth metal layer M05 may be patterned into an RX line RXL through which a signal RX photoelectrically converted by the organic photodiode OPD is outputted. The VDD line PL1 may be formed of at least one of the fourth metal layer M04 or the fifth metal layer M05.

Wires to which the same signal or power voltage is applied between metals may be connected through a jumper pattern and a contact hole.

The storage capacitor Cst1 of the pixel circuit CPIX may be formed between the pattern of the second metal layer M02 and the pattern of the third metal layer M03 which are overlap each other. A storage capacitor Cst2 of the photosensor driving circuit COPD may be formed between the metallized semiconductor pattern ACTM and the pattern of the third metal layer M03 which are overlap each other.

The photosensor driving circuit COPD requires the gate line to which the exposure signal is applied and the Rx line through which the output signal of the organic photodiode is outputted. The gate line to which the exposure signal is applied may be formed of a metal pattern of any one of the second to fourth metal layers M02, M03, and M04, but is not limited thereto. The Rx line may be formed of a metal pattern of any one of the fourth and fifth metal layers M04 and M05, but is not limited thereto.

Figure 12:
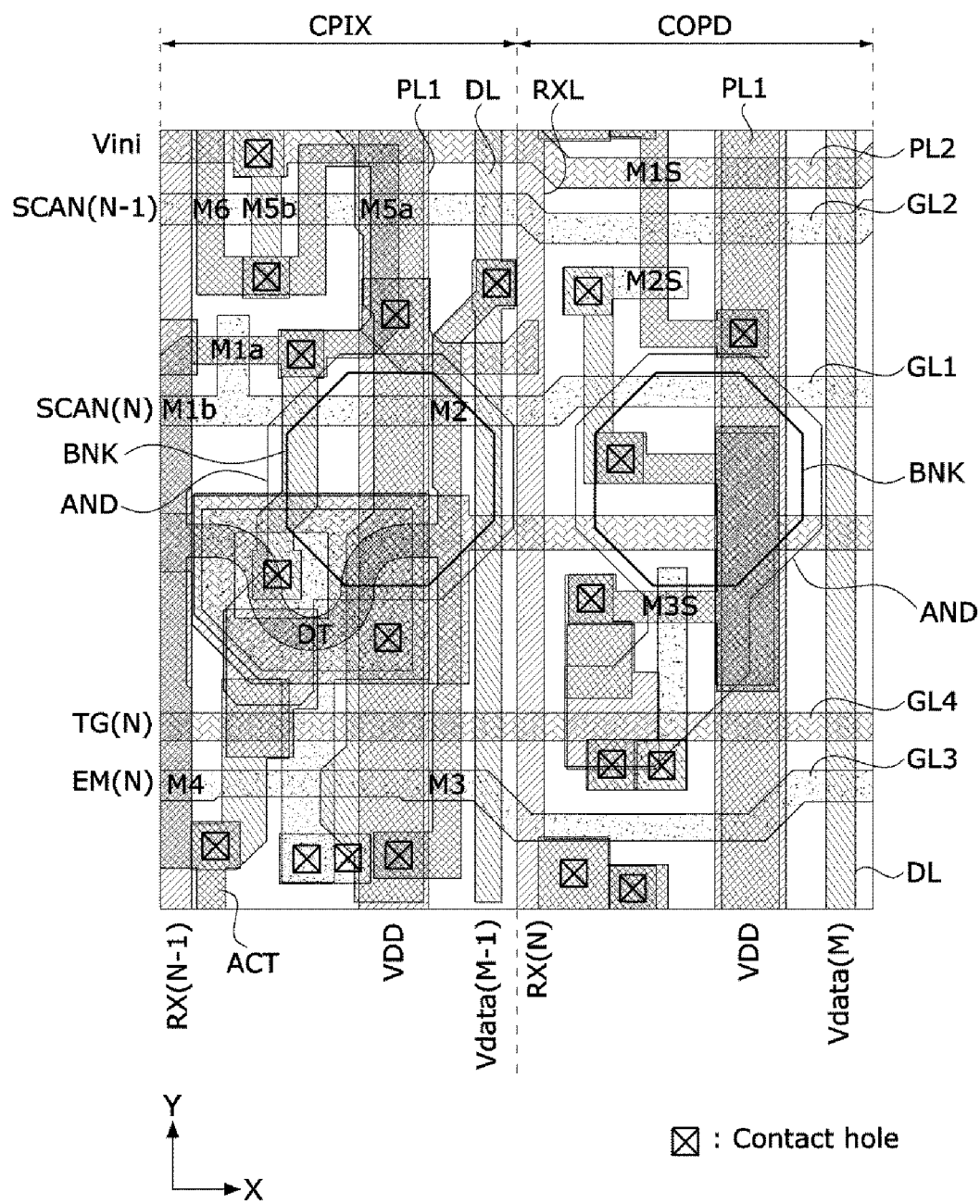
FIG. 12 is a plan view showing in detail a layout of a pixel circuit and a photosensor driving circuit.

FIG. 12 is a plan view showing in detail a layout of a pixel circuit and a photosensor driving circuit. FIGS. 13A to 13G are plan views showing the pattern shapes of main layers separated from the layout of the pixel circuit and photosensor driving circuit shown in FIG. 12. In FIG. 12, M3S denotes third-S switch elements M3SP and M3SN.

As can be seen from FIG. 12 and FIGS. 13A to 13G, the first gate line GL1, the second gate line GL2, and the third gate line GL3 may be arranged parallel to each other on a first plane on the active pattern. The gate lines GL1, GL2, and GL3 disposed on the first plane cross the data line DL, the VDD line PL1, and the RX line RXL. The Vini line PL2 and a fourth gate line GL4 may be arranged parallel to each other on a second plane above the first plane. The data line DL and the VDD line PL1 may be arranged parallel to each other on a third plane above the second plane. The RX line RXL and the VDD line PL1 are arranged parallel to each other on a fourth plane above the third plane. The VDD lines PL1 disposed on the second and third planes are connected to each other to receive the same pixel driving voltage VDD.

Figure 13A:
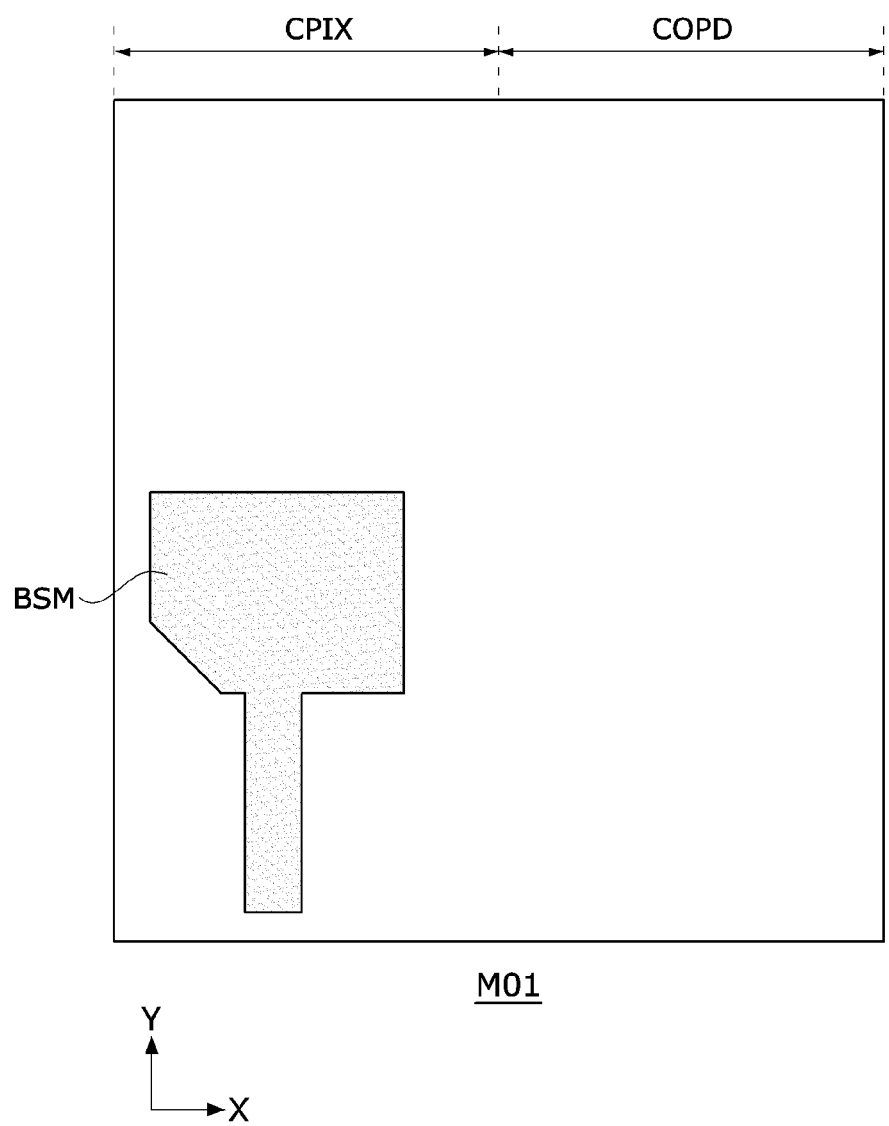
FIGS. 13A to 13G are plan views showing a pattern shape of each layer by separating main layers from the layout of the pixel circuit and photosensor driving circuit shown in FIG. 12.
Figure 13B:
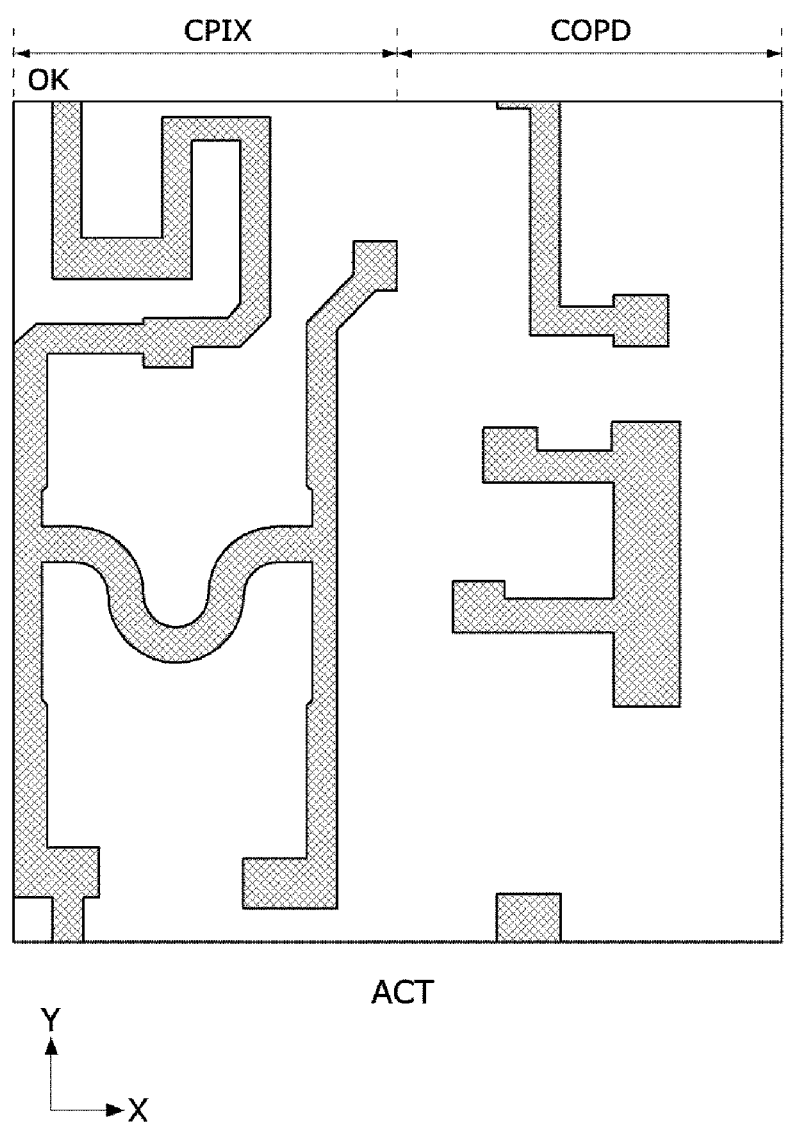

The first metal layer M01 may be patterned in a shape as shown in FIG. 13A. The first metal layer M01 may include the light shield pattern BSM overlapping the active pattern of the TFT in the pixel circuit CPIX. The active layer ACT may be patterned in a shape as shown in FIG. 13B. The active layer ACT includes the active patterns of the TFTs in the pixel circuit CPIX and the photosensor driving circuit COPD, and a metallized pattern.

Figure 13C:
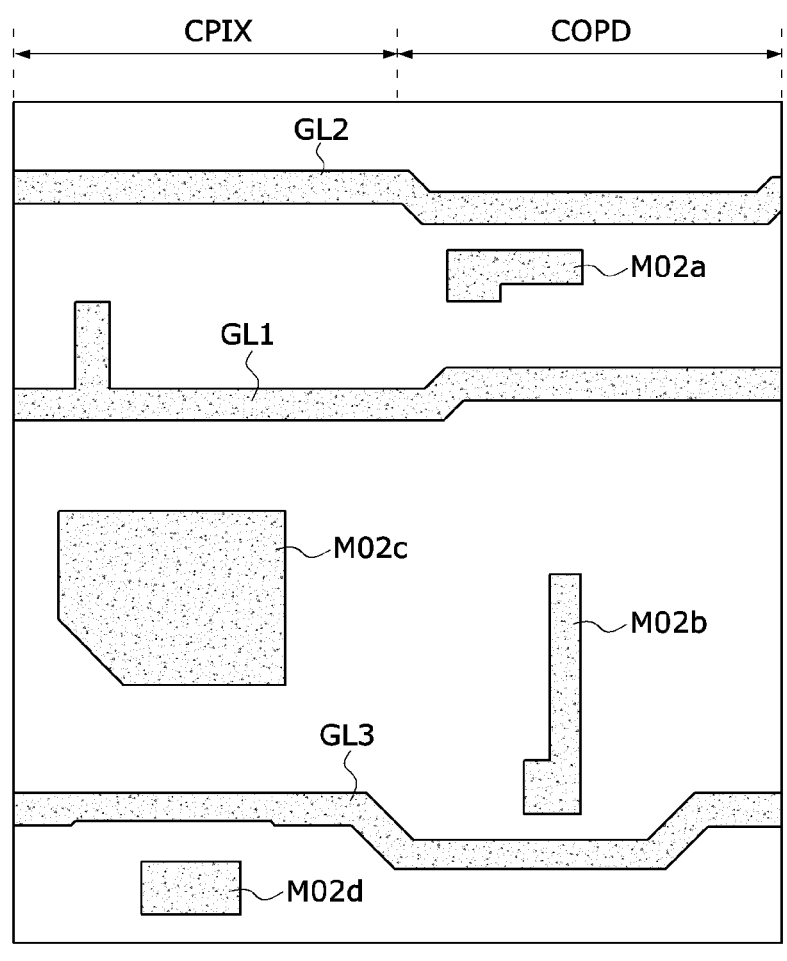

The second metal layer M02 may be patterned in a shape as shown in FIG. 13C. The second metal layer M02 may include the gate lines GL1, GL2, and GL3 to which the scan pulse and the EM pulse are applied, the gate electrode of the TFT, a lower electrode M02c of the first storage capacitor Cst1, and jumper patterns M02a, M02b, and M02d, and the like. The jumper patterns M02a and M02b are used to connect the metal layers through a contact hole.

Figure 13D:
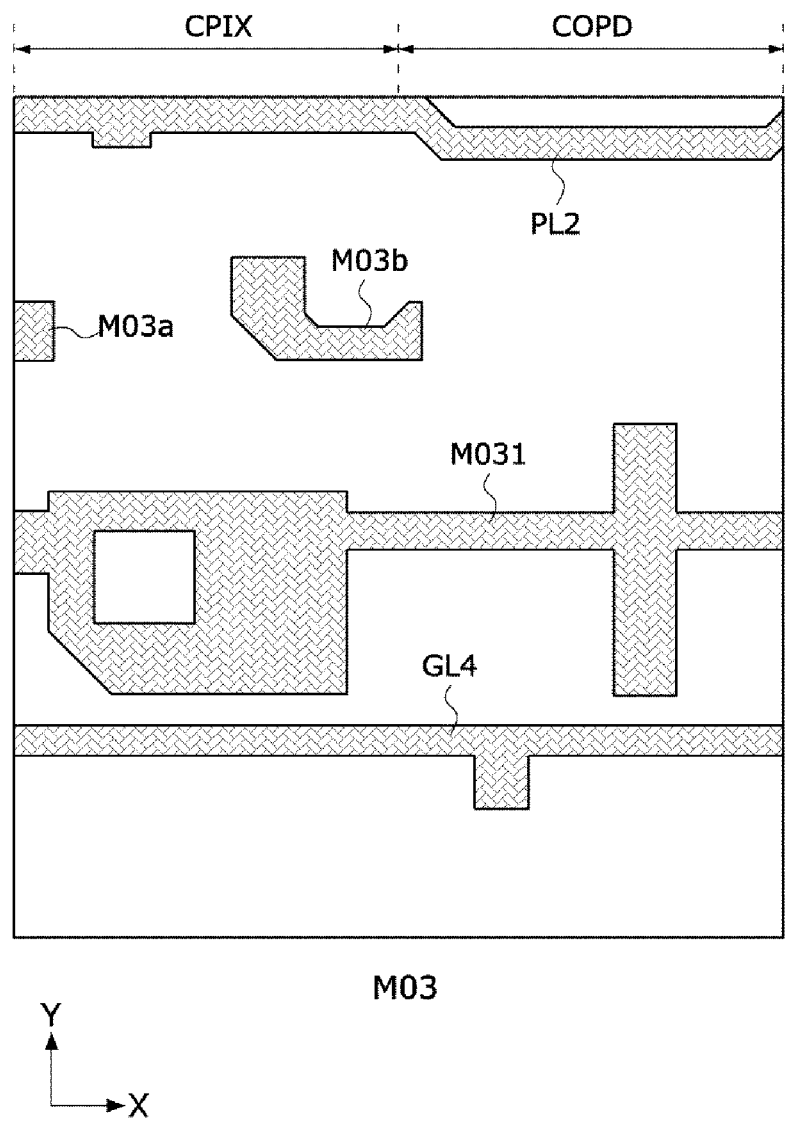

The third metal layer M03 may be patterned in a shape as shown in FIG. 13D. The third metal layer M03 may include a pattern M031 in which the upper electrode of the first storage capacitor Cst1 and the lower electrode of the second storage capacitor Cst2 are integrated, the Vini line PL2, the fourth gate line, and jumper patterns M03a and M03b, and the like. The exposure signal of the photosensor driving circuit COPD may be applied to the fourth gate line.

Figure 13E:
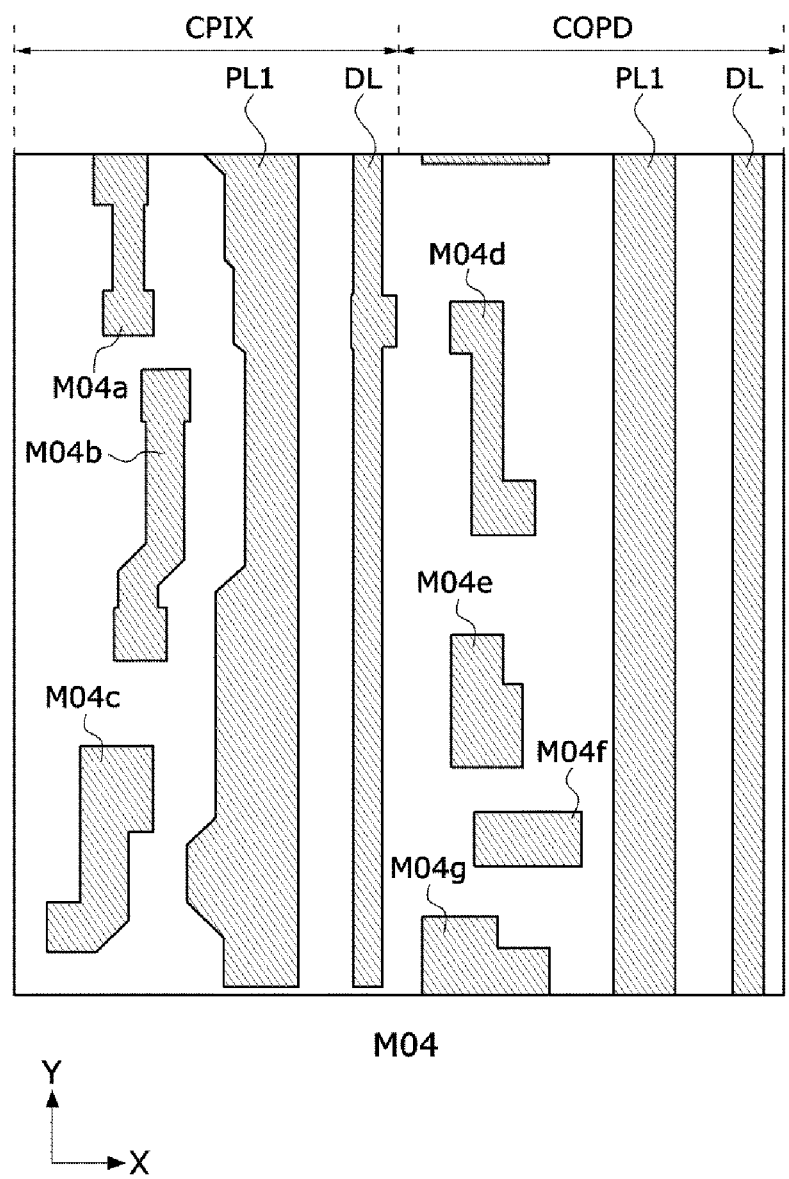

The fourth metal layer M04 may be patterned in a shape as shown in FIG. 13E. The fourth metal layer M04 may include the VDD line PL1, the data line DL, jumper patterns M04a to M04g, and the like. The upper electrode of the second storage capacitor may be integrated with the VDD line PL1 of the fourth metal layer M04.

Figure 13F:
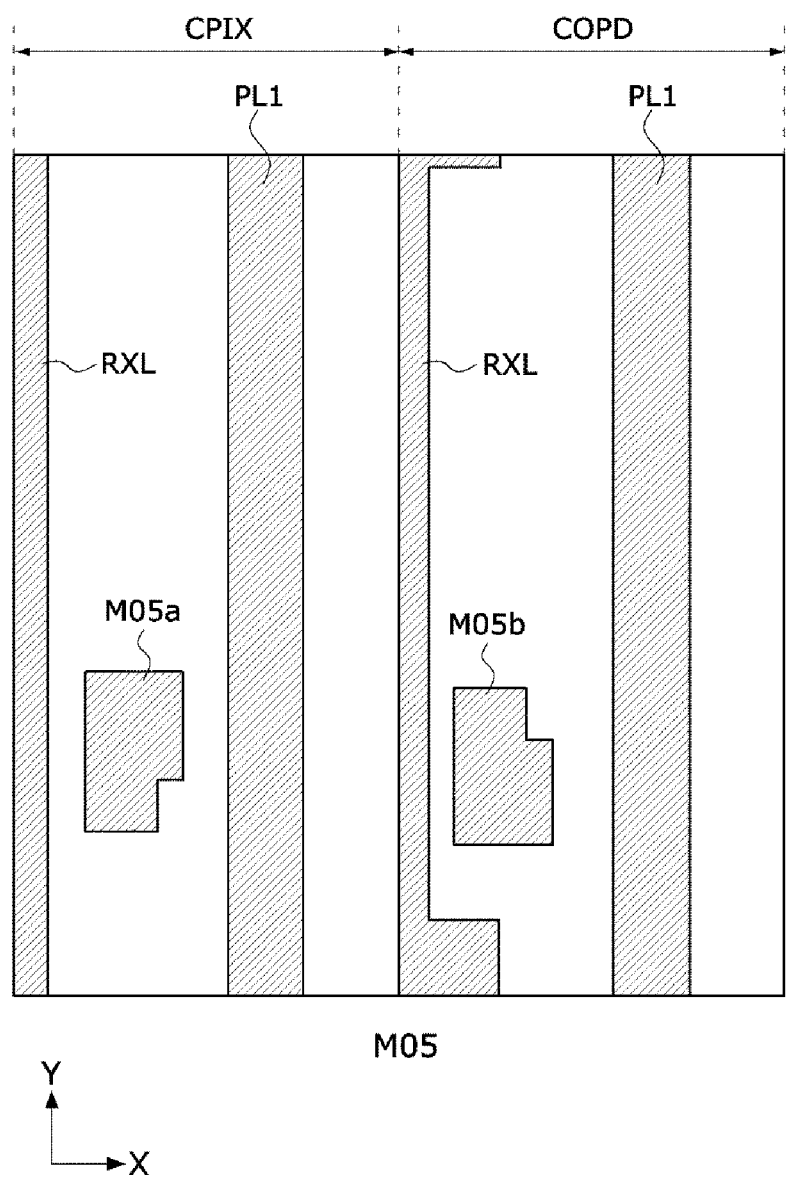
Figure 13G:
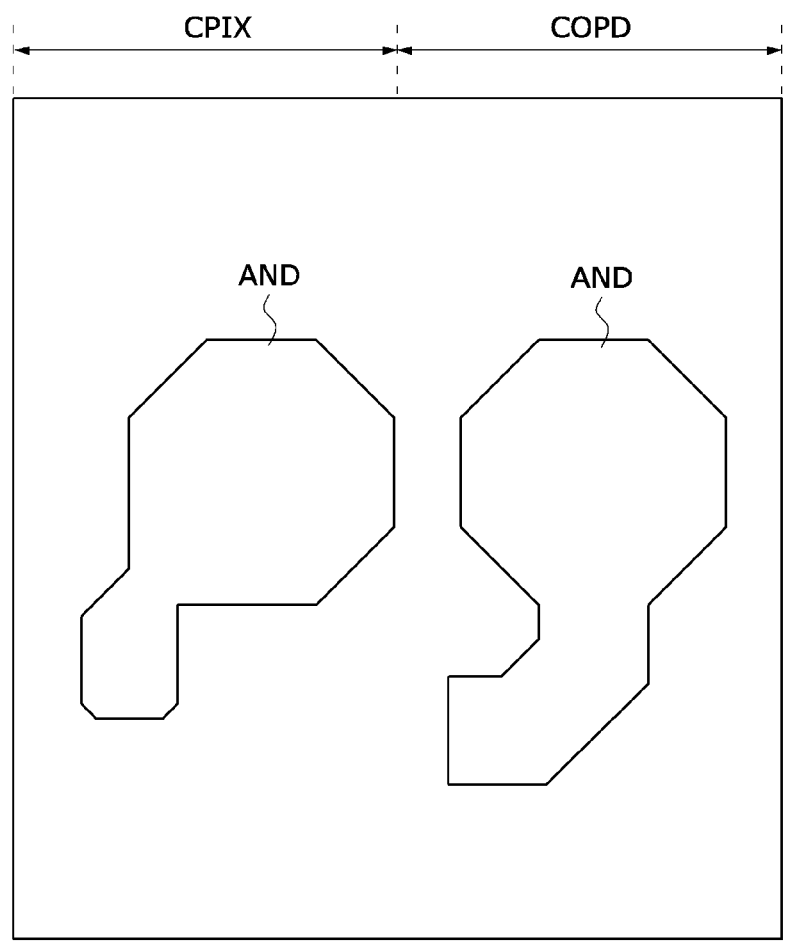

The fifth metal layer M05 may be patterned in a shape as shown in FIG. 13F. The fifth metal layer M05 may include the VDD line PL1, the RX line RXL, jumper patterns M05a and M05b, and the like. The anode electrodes AND of the pixel circuit CPIX and the photosensor driving circuit COPD may be patterned in a shape as shown in FIG. 13G. The anode electrode AND of the pixel circuit CPIX and the anode electrode AND of the photosensor driving circuit COPD may be formed on the same plane.

Figure 14:
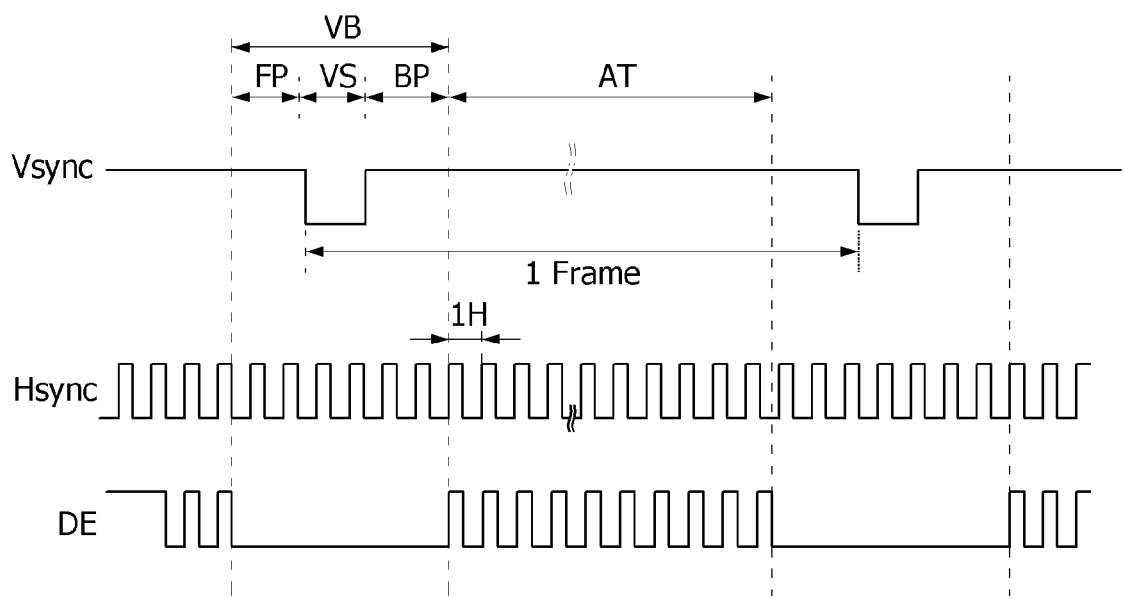
FIG. 14 is a diagram showing in detail an active interval and a vertical blank period of one frame period.

FIG. 14 is a diagram showing in detail an active interval and a vertical blank period in one frame period.

Referring to FIG. 14, one frame period is divided into an active interval AT during which pixel data is inputted from the host system 200 and a vertical blank period VB having no pixel data. During the active interval AT, one frame of pixel data to be written to all pixels on a screen AA of the display panel 100 is received by the drive IC 300 and written to the pixels P.

The vertical blank period VB is a blank period during which pixel data is not received by the drive IC 300 between the active interval AT in an $(N-1)^{th}$ (N being a natural number) frame period and the active interval AT in an $N^{th}$ frame period. The vertical blank period VB includes a vertical sync time VS, a vertical front porch FP, and a vertical back porch BP.

A vertical synchronization signal Vsync defines one frame period. A horizontal synchronization signal Hsync defines one horizontal period 1H. A data enable signal DE defines a period of effective data including pixel data to be displayed on the screen. The pulse of the data enable signal DE is synchronized with the pixel data to be written to the pixels of the display panel 100. One pulse period of the data enable signal DE is one horizontal period 1H.

Figure 15:
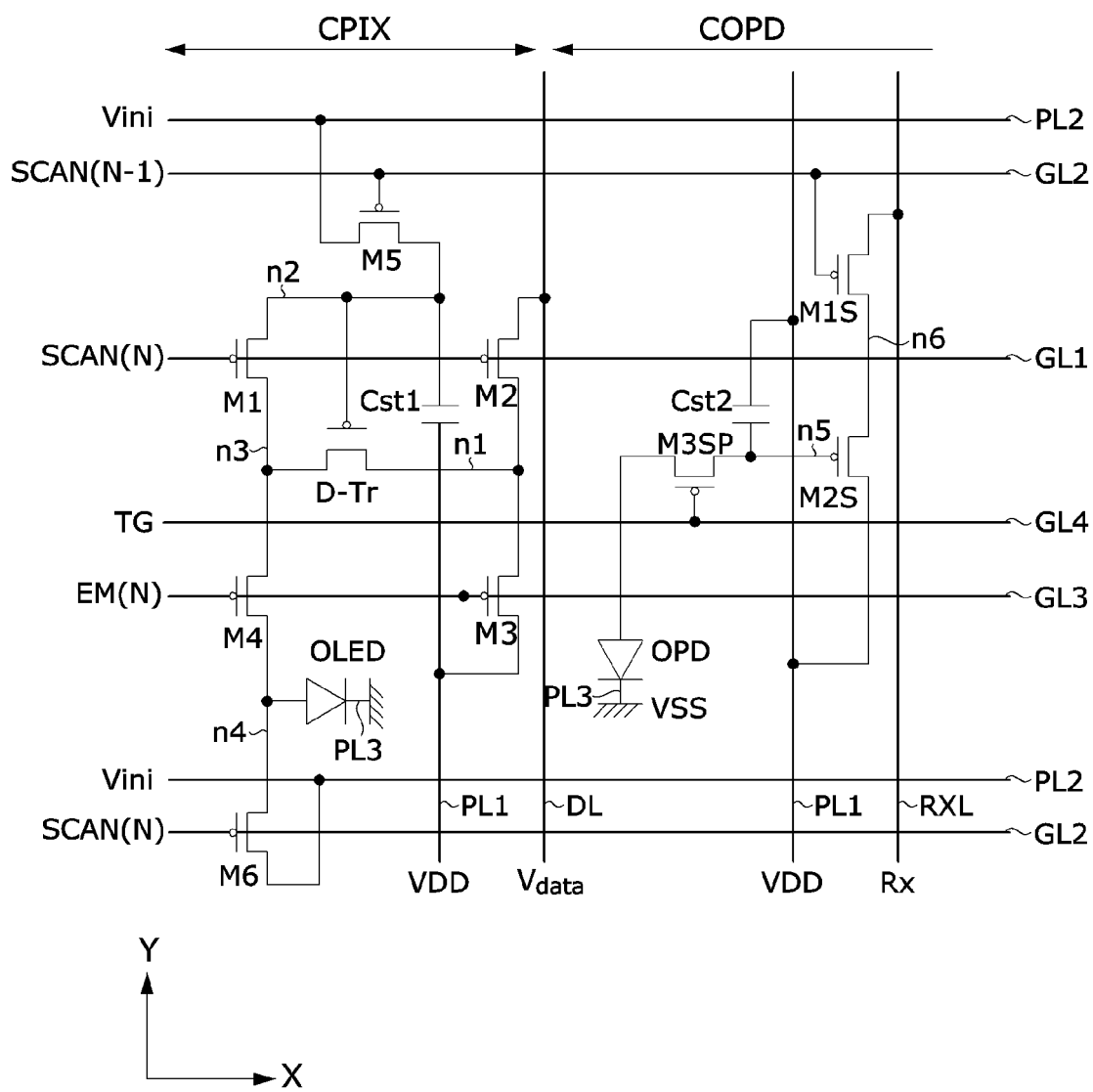
FIG. 15 is a circuit diagram showing a pixel circuit and a photosensor driving circuit according to a first aspect of the present disclosure.
Figure 16:
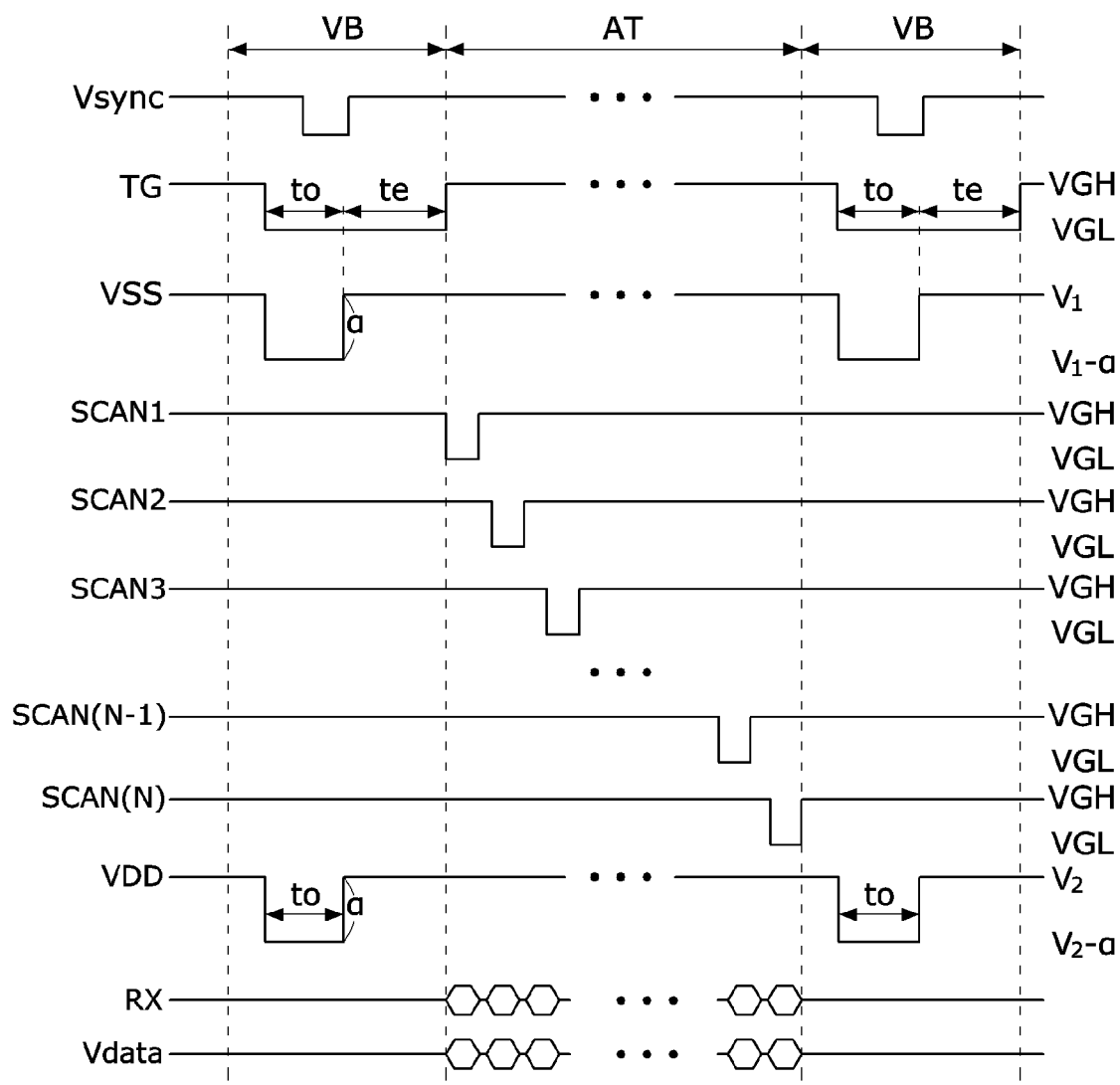
FIG. 16 is a waveform diagram showing a method of driving the pixel circuit and the photosensor driving circuit shown in FIG. 15.

FIG. 15 is a circuit diagram showing a pixel circuit and a photosensor driving circuit according to a first aspect of the present disclosure. FIG. 16 is a waveform diagram showing a method of driving the pixel circuit and the photosensor driving circuit shown in FIG. 15. Since the pixel circuit has been described above with reference to FIGS. 7 and 8, a detailed description thereof will be omitted.

Referring to FIG. 15, power such as VDD and VSS is applied to the pixel circuit CPIX and the photosensor driving circuit COPD.

The photosensor driving circuit COPD drives the organic photodiode OPD to output a signal RX photoelectrically converted by the organic photodiode OPD. The signal RX photoelectrically converted by the organic photodiode OPD may be transmitted to the fingerprint recognition processor 500 through the RX line RXL.

The photosensor driving circuit COPD is connected to the VDD line PL1, the VSS line PL3, the second and fourth gate lines GL2 and GL4, the RX line RXL, and the like. The second and fourth gate lines GL2 and GL4 may be formed of parallel lines crossing the RX line RXL and the data line DL on the pixel array. The RX line RXL may be formed of lines parallel to the data line DL and the VDD line PL1.

The photosensor driving circuit COPD includes a switch circuit which is connected to the organic photodiode OPD, the capacitor Cst2, and the gate lines GL2 and GL4 to switch a current path between the photodiode and the RX line RXL in response to the scan pulse SCAN(N-1) and the exposure signal TG.

The switch circuit is connected to the organic photodiode OPD, the capacitor Cst2, the VDD line PL1, the VSS line PL3, the RX line RXL, the second gate line GL2, and the fourth gate line GL4. The switch circuit includes first-S to third-S switch elements M1S, M2S, and M3SP. The first S to third S switch elements M1S, M2S, and M3SP may be implemented as p-channel TFTs.

The organic photodiode OPD includes an anode electrode connected to the third S switch element M3SP, a cathode electrode to which the low potential power voltage VSS is applied, and an active layer formed between the anode electrode and the cathode electrode. The active layer of the organic photodiode OPD includes an organic semiconductor material. The organic photodiode OPD generates a photoelectric conversion signal RX by generating a current according to received light when a reverse bias voltage is applied. It should be noted that the anode electrode of the organic photodiode OPD and the anode electrode of the light emitting element OLED are disposed on the same layer in the cross-sectional structure of the display panel 100 and share the cathode electrode. Due to this structure, the anode electrode of the organic photodiode OPD is connected to the first electrode of the third-S switch element M3SP.

The capacitor Cst2 is connected between the gate electrode of the second-S switch element M2S connected to a fifth node n5 and the VDD line PL1. When the third-S switch element M3 SP is turned on, the capacitor Cst2 is charged by electric charges from the organic photodiode OPD to store the voltage of the photoelectrically converted signal. The exposure time of a photosensor S is determined according to the pulse width of the exposure signal TG applied to the gate electrode of the third-S switch element M3SP. As the pulse width of the exposure signal TG increases, the charge amount of the capacitor Cst2 may increase by the photosensor S.

The first-S switch element M1S is turned on in response to the gate-on voltage VGL of the $(N-1)^{th}$ scan pulse SCAN(N-1) to connect a sixth node n6 to the RX line RXL. The sixth node n6 is connected to the second electrode of the first-S switch element M1S and the first electrode of the second-S switch element M2S. The gate electrode of the first-S switch element M1S is connected to the second gate line GL2 to receive the $(N-1)^{th}$ scan pulse SCAN(N-1). The first electrode of the first-S switch element M1S is connected to the RX line RXL, and the second electrode of the first-S switch element M1S is connected to the sixth node n6.

The second-S switch element M2S adjusts the amount of a current flowing through the RX line RXL between the VDD line PL1 and the sixth node n6 according to the gate voltage, i.e., the voltage of the fifth node n5. The second-S switch element M2S includes a gate electrode connected to the fifth node n5, a first electrode connected to the sixth node n6, and a second electrode connected to the VDD line PL1. The fifth node n5 is connected to the second electrode of the third-S switch element M3 SP, the capacitor Cst2, and the gate electrode of the second-S switch element M2S.

The third-S switch element M3 SP is turned on according to the gate-on voltage VGL of the exposure signal TG to connect the anode electrode of the organic photodiode OPD to the fifth node n5. When the third-S switch element M3SP is in the on state, electric charges from the organic photodiode OPD are stored in the capacitor Cst2. The third-S switch element M3SP includes a gate electrode connected to the fourth gate line GL4 to which the exposure signal TG is applied, a first electrode connected to the anode electrode of the organic photodiode OPD, and a second electrode connected to the fifth node n5.

The anode electrodes of the organic photodiode OPD and the light emitting element OLED may be formed on the same layer, and the cathode electrodes of the organic photodiode OPD and the light emitting element OLED may be formed on the same layer to be shared. In addition, the pixel circuit CPIX and the photosensor driving circuit COPD share at least one gate line. Therefore, when the anode electrode of the organic photodiode OPD is connected to the third-S switch element M3SP, the organic photodiode OPD may be connected to the photosensor driving circuit COPD without additional wiring, and the power lines PL1 and PL3 and the gate lines GL2 and GL4 are shared, so that the present disclosure can simplify the structure of the display panel 100 to minimize the increase in the number of manufacturing processes, thereby lowering the manufacturing cost.

In FIG. 15, the photosensor driving circuit COPD is exemplified as a 3T1C circuit including three transistors and one capacitor, but is not limited thereto. For example, the photosensor driving circuit COPD may be implemented as a 4T1C circuit including four transistors and one capacitor.

The photosensor driving circuit COPD is initialized during the vertical blank period VB as shown in FIG. 16.

Referring to FIG. 16, the vertical blank period VB includes a reset time $t_o$ and an exposure time $t_e$ of the photosensor driving circuit COPD. During the active interval AT in which pixel data is received by the timing controller 303, the scan pulses SCAN(N−1) and SCAN(N) and the EM pulse EM(N) are generated and sequentially shifted.

In order to reset the photosensor driving circuit COPD, the voltage levels of the exposure signal TG, the low potential power voltage VSS, and the pixel driving voltage VDD are changed within the vertical blank period VB. During the reset time $t_o$, the organic photodiode OPD and the third-S switch element M3SP are turned on, and the voltage of the fifth node n5 is set to the low potential power voltage VSS=$V_1$−α.

Since the pixel circuit CPIX and the photosensor driving circuit COPD share the power lines PL1 and PL3, the low potential power voltage VSS and the pixel driving voltage VDD are applied thereto. In the pixel circuit CPIX, when a voltage applied to both ends of the light emitting element OLED changes, a current also changes, and thus a luminance changes. Accordingly, during the reset time $t_o$ of the photosensor driving circuit COPD, in order not to change the luminance of the pixel circuit, the voltage at both ends of the light emitting element OLED should not be changed while the voltage levels of the low potential power voltage VSS and the pixel driving voltage VDD are changed. In other words, the fluctuation widths of the low potential power voltage VSS and the pixel driving voltage VDD are set to be the same.

The exposure signal TG is generated as the pulse of the gate-on voltage VGL during the reset time $t_o$ and the exposure time $t_e$, and is maintained at the gate-off voltage VGH during the other time. Accordingly, the third-S switch element M3SP is turned on during the reset time $t_o$ and the exposure time $t_e$. After the capacitor Cst2 is discharged during the reset time $t_o$, it is charged with the electric charges from the organic photodiode OPD during the exposure time $t_e$ to store the electric charges of the photoelectrically converted signal RX.

The low potential power voltage VSS is lowered to a predetermined voltage $V_1$−α during the reset time $t_o$, and is maintained at a voltage $V_1$ during the other time. During the reset time $t_o$, the cathode voltage of the organic photodiode OPD is lowered to $V_1$−α, so that a forward bias is applied to the organic photodiode OPD. Accordingly, the organic photodiode OPD and the third-S switch element M3SP are turned on during the reset time $t_o$ to set the voltage of the fifth node n5 to $V_1$−α. The second-S switch element M2S is turned on during the reset time $t_o$. $V_1$−α may be set to a voltage lower than $V_1$ and higher than the gate-on voltage VGL.

During the reset time $t_o$, the voltage at both ends of the light emitting element OLED should not be changed so as not to change the current of the light emitting element OLED. To this end, during the reset time $t_o$, the pixel driving voltage VDD decreases as much as a change α of the low potential power voltage VSS. The pixel driving voltage VDD decreases to $V_2$−α during the reset time $t_o$, and is maintained at a voltage V2 during the other time. The voltage levels of the pixel driving voltage VDD and the low potential power voltage VSS may decrease at the same time and increase at the same time. V2 may be set to a voltage higher than $V_1$ and lower than the gate-off voltage VGH.

During the exposure time $t_o$, the low potential power voltage VSS rises to V1. The third-S switch element M3SP is maintained in the on state according to the gate-on voltage VGL during the exposure time $t_o$. At this time, since the cathode voltage of the organic photodiode OPD rises to $V_1$ and the anode voltage thereof is $V_1$−α, a reverse bias is applied to the organic photodiode OPD. During the exposure time $t_o$, the second-S switch element M2S is maintained in the on state because its gate voltage is $V_1$−α.

During the exposure time $t_e$, when light is irradiated to the active layer ACT-OPD of the organic photodiode OPD, a photo current is generated, so that the voltage of the capacitor Cst2 changes in proportion to the amount of received light to store the photoelectric conversion signal RX.

The exposure time $t_e$ is determined according to the pulse width of the exposure signal TG. The exposure time $t_e$ may be set in the vertical blank period VB before pixel data is written to the display pixels, but is not limited thereto. The exposure time to may be extended until a first scan pulse SCNA1 is generated as the gate-on voltage VGL according to the pulse width of the exposure signal TG. In another aspect, according to the position of the sensing area SA, it may be extended into the active interval AT and overlap one or more scan pulses.

During the active interval AT, the display pixels are sequentially scanned so that the pixel data is written to the display pixels, and sensing data, i.e., the photoelectric conversion signal RX, obtained from the photosensors is read out. During the active interval AT, the scan pulses SCAN1 to SCAN(N) synchronized with the data voltage Vdata of the pixel data are sequentially applied to the gate lines GL1 and GL2. The first-S switch element M1S of the photosensor driving circuit COPD is turned on in response to the gate-on voltage VGL of the scan pulse SCAN(N−1) during the active interval AT to connect the sixth node n6 to the RX line RXL. In this case, a current flowing through the channel of the second-S switch element M2S in which the gate-source voltage is set as the voltage of the photoelectric conversion signal RX flows to the RX line RXL through the first-S switch element M1S.

In the pixel circuit CPIX and the photosensor driving circuit COPD which share the gate lines GL2 and GL4 so that the data voltage Vdata does not affect the photoelectric conversion signal RX, the scan pulse for controlling the second switch element M2 of the pixel circuit may be separated from the scan pulse for controlling the first-S switch element M1S of the photosensor driving circuit COPD. As an example, the gate electrode of the second switch element M2 may be connected to the first gate line GL1 to which the $N^{th}$ scan pulse SCAN(N) is applied, and the gate electrode of the first-S switch element M1S may be connected to the second gate line GL2 to which the $(N-1)^{th}$ scan pulse SCAN(N−1) is applied. The scan pulse for controlling the first-S switch element M1S is not limited to the $(N-1)^{th}$ scan pulse SCAN(N−1).

Figure 17:
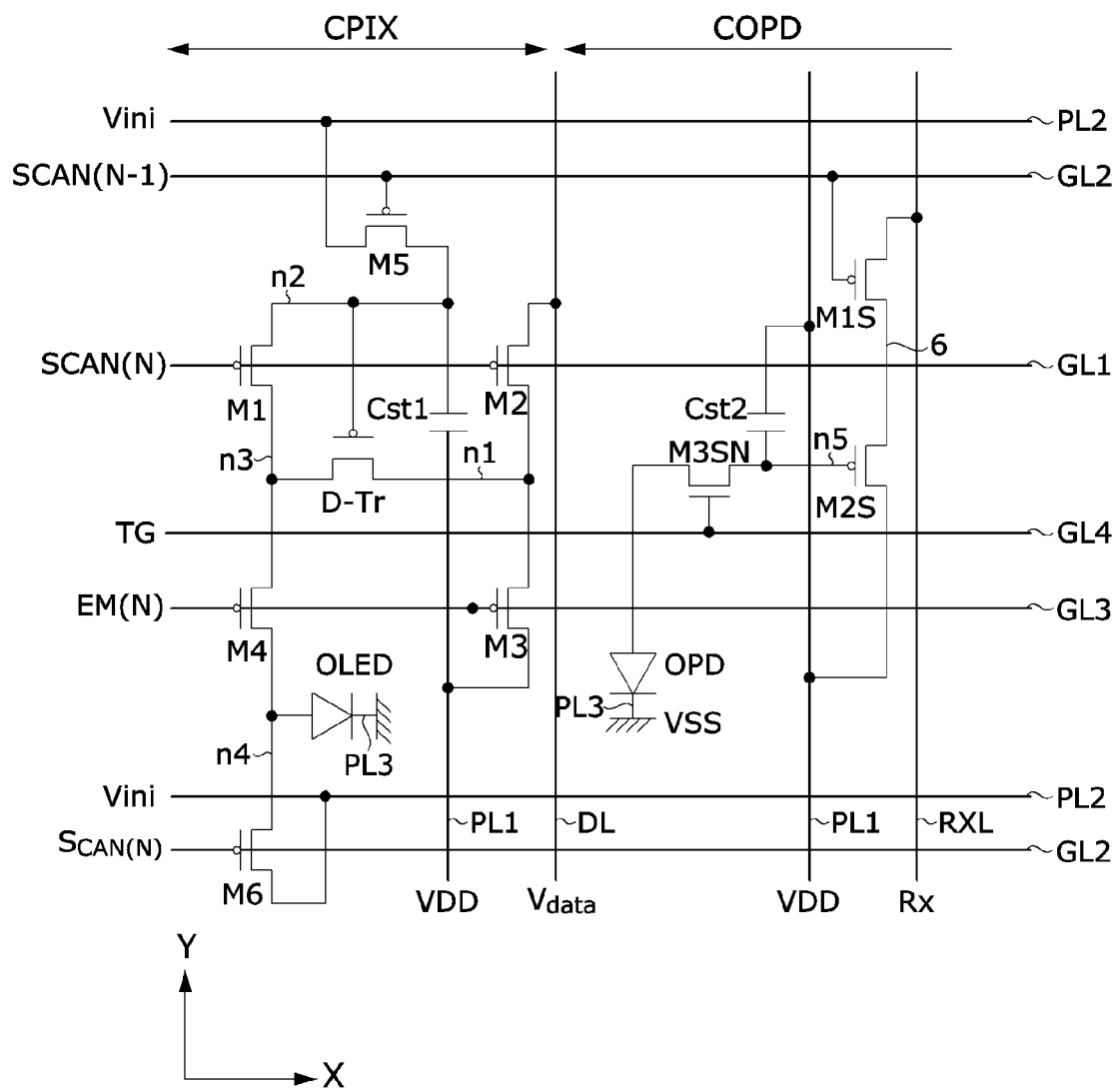
FIG. 17 is a circuit diagram showing a pixel circuit and a photosensor driving circuit according to a second aspect of the present disclosure.
Figure 18:
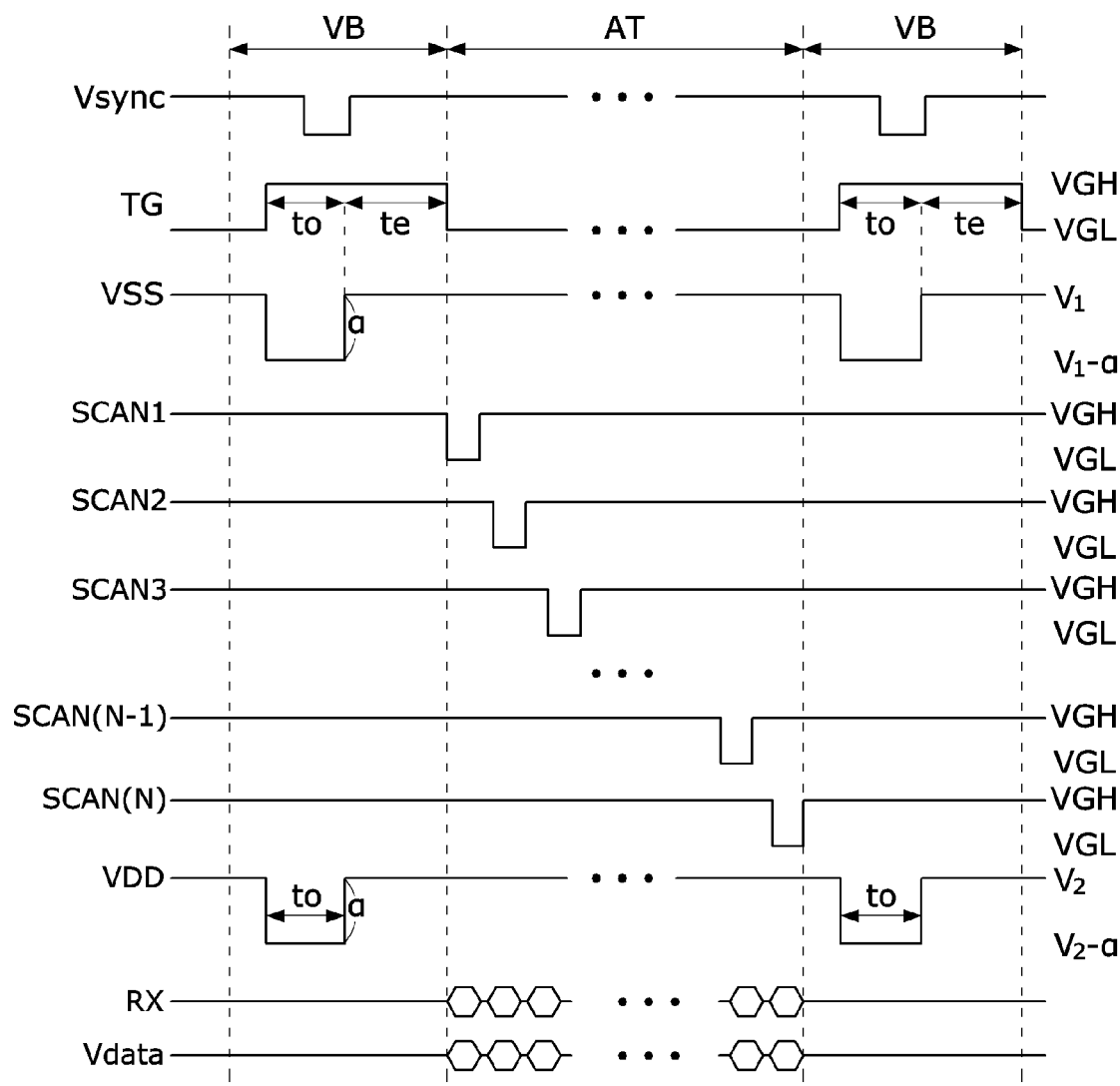
FIG. 18 is a waveform diagram showing a method of driving the pixel circuit and the photosensor driving circuit shown in FIG. 17.

FIG. 17 is a circuit diagram showing a pixel circuit and a photosensor driving circuit according to a second aspect of the present disclosure. FIG. 18 is a waveform diagram showing a method of driving the pixel circuit and the photosensor driving circuit shown in FIG. 17. In FIGS. 17 and 18, components that are substantially the same as those of the above-described aspect are denoted by the same reference numerals, and detailed descriptions thereof will be omitted.

Referring to FIGS. 17 and 18, a third-S switch element M3SN of the photosensor driving circuit COPD may be implemented as an n-channel oxide TFT to reduce a leakage current (off current) in the off state. In the n-channel TFT, the gate-on voltage is VGH. Accordingly, the pulse of the exposure signal TG is generated as the pulse of the gate-on voltage VGH during an initialization time $t_o$ and the exposure time $t_o$.

Figure 19:
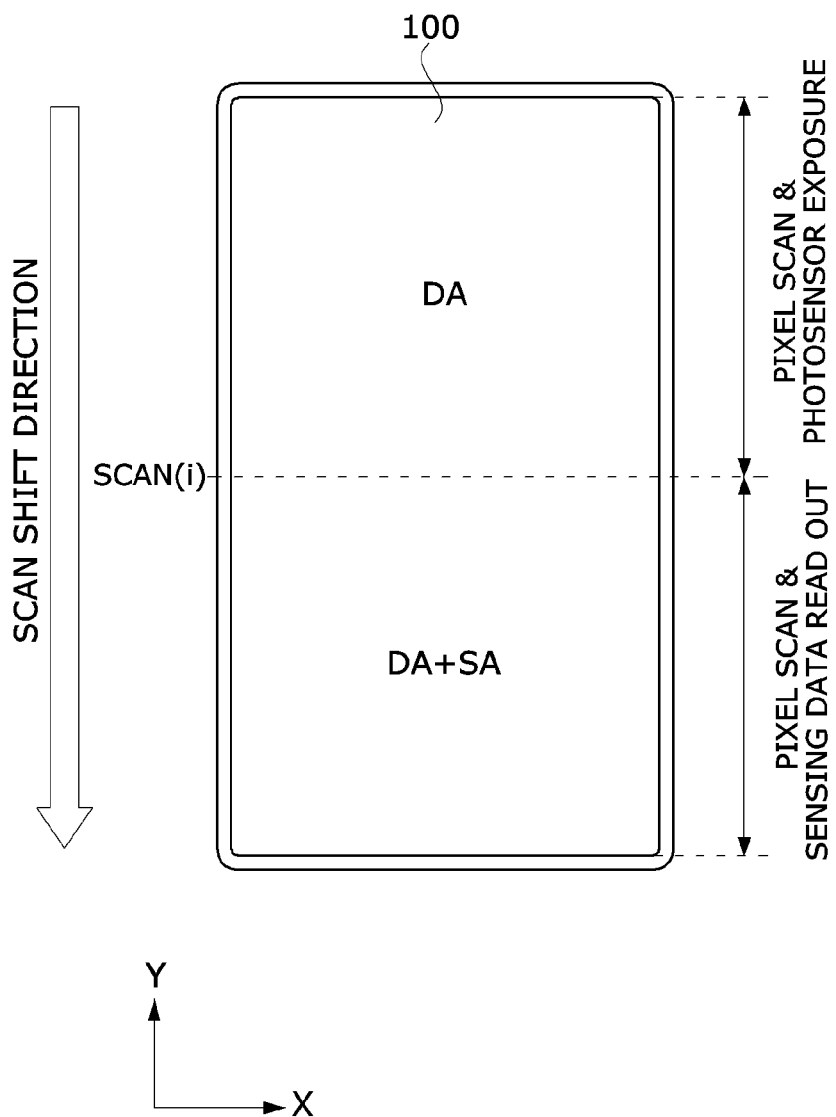
FIGS. 19 to 21 are diagrams showing a method of driving a photosensor driving circuit according to another aspect of the present disclosure.
Figure 20:
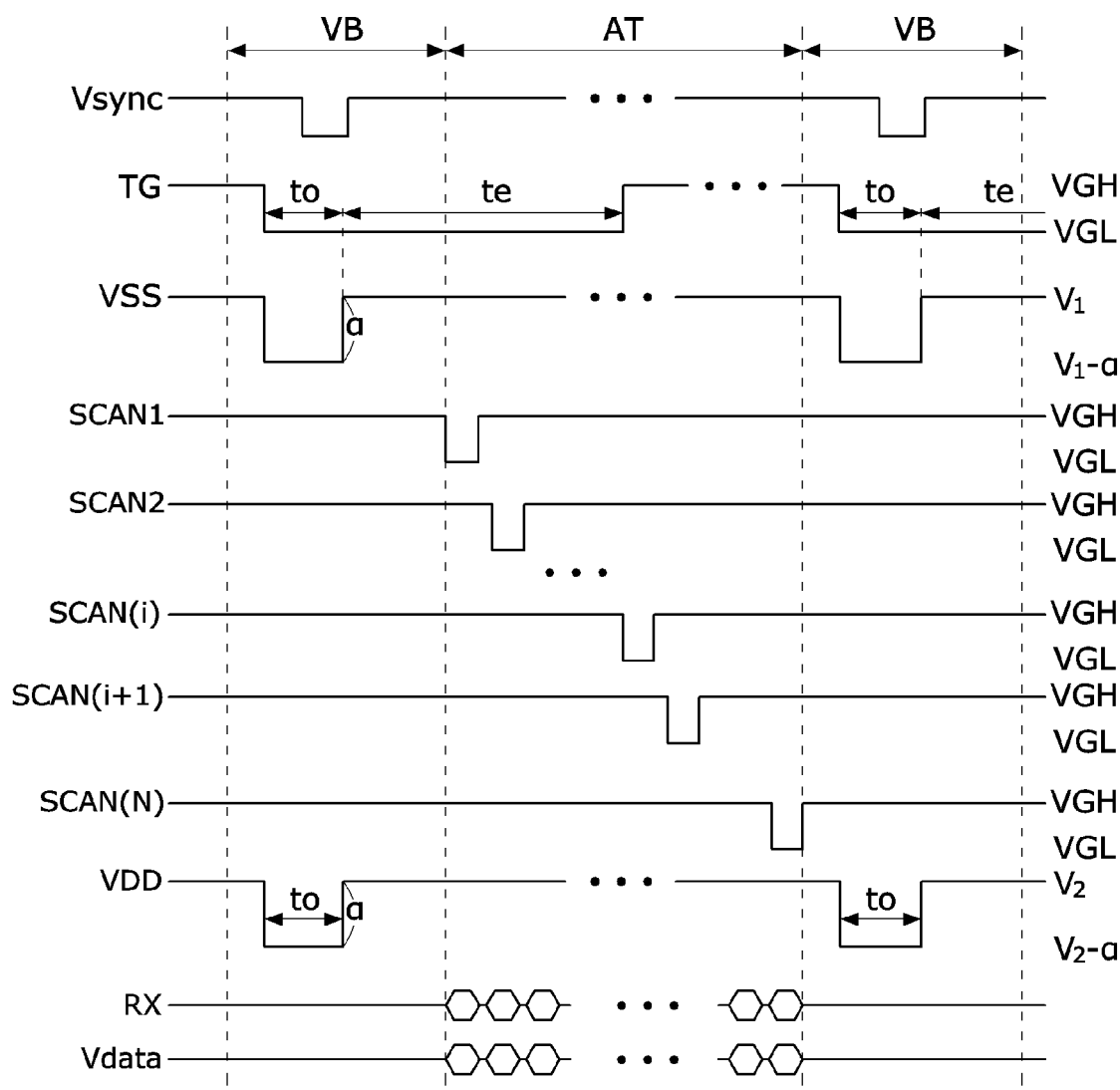
Figure 21:
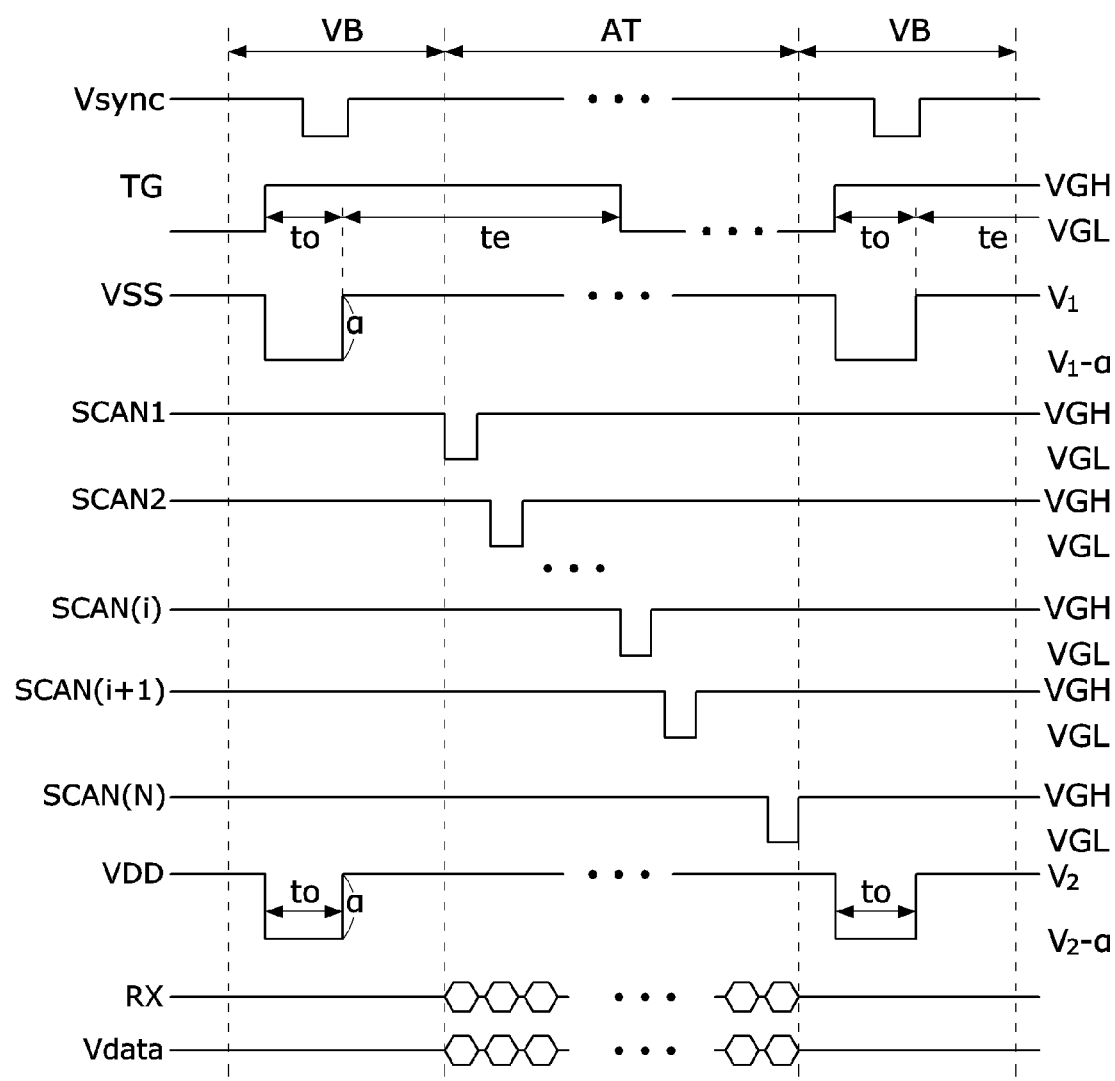

FIGS. 19 to 21 are diagrams showing a method of driving a photosensor driving circuit according to another aspect of the present disclosure.

Referring to FIGS. 19 to 21, the exposure time $t_o$ of the sensor pixels may be extended into the active interval AT. The pixel data is written to the display pixels when the scan pulses of the display area DA are shifted in the shift direction of the scan pulse.

When the scan pulses are sequentially shifted in the sensing area SA, the pixel data is written to the display pixels R, G, and B, and the photoelectric conversion signal, i.e., sensing data, is read out from the sensor pixels S. The pulse of the exposure signal TG may overlap the scan pulses SCAN1 and SCAN2 and the EM pulse generated in front of the sensing area SA, and do not overlap the scan pulse and the EM pulse of the sensing area SA. In other words, the exposure signal TG is inverted to the gate-off voltage before an $i^{th}$ (i being a positive integer smaller than N) scan pulse SCAN(i), at which scanning of the sensing area SA starts, is generated.

Figure 22:
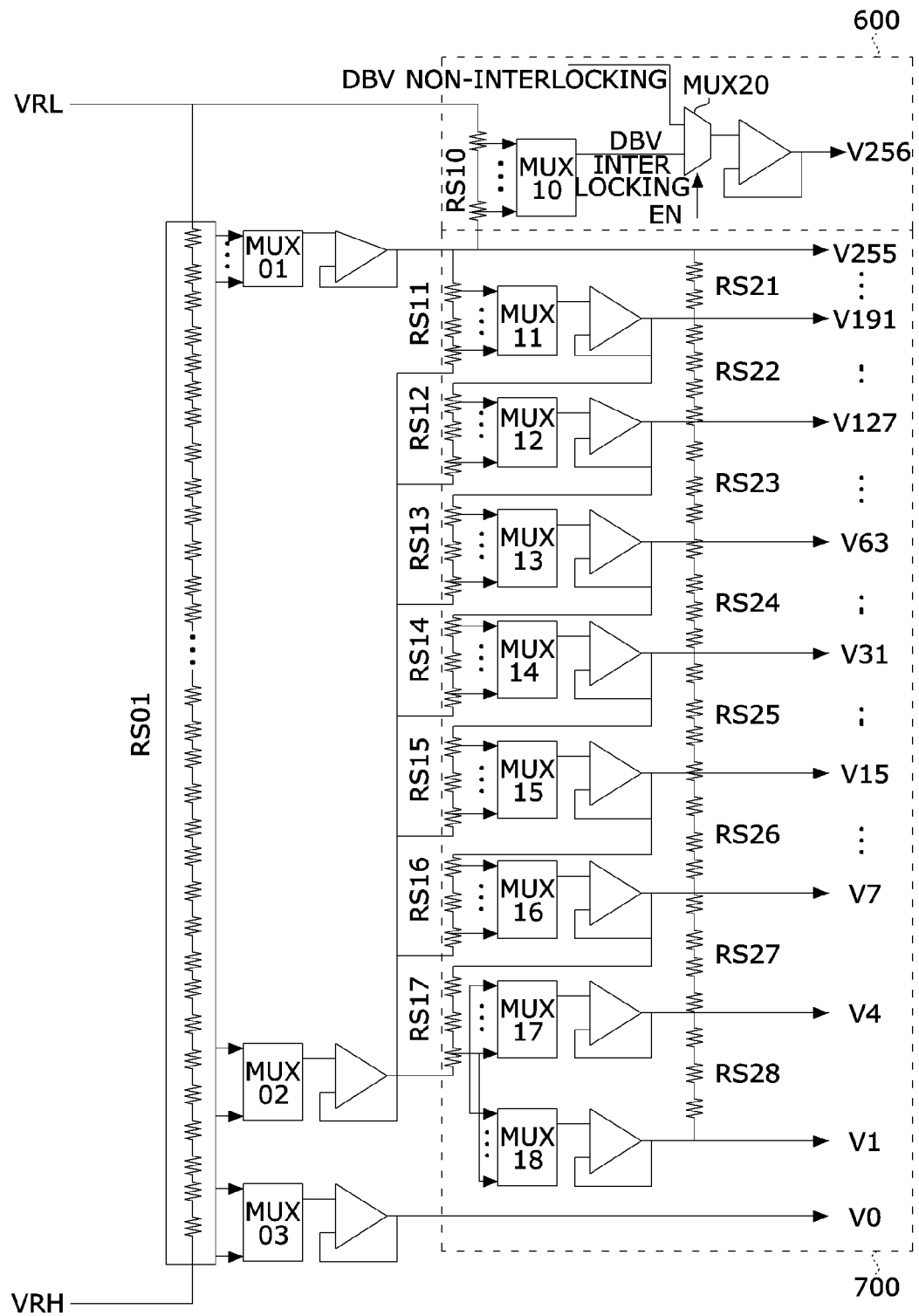
FIG. 22 is a circuit diagram showing a gamma compensation voltage generator according to an aspect of the present disclosure.

FIG. 22 is a circuit diagram showing a gamma compensation voltage generator 305 according to an aspect of the present disclosure.

Referring to FIG. 22, the gamma compensation voltage generator 305 receives a high potential input reference voltage VRH and a low potential input reference voltage VRL from the power supply unit 304 and outputs a gamma compensation voltage (or display driving voltage) for each grayscale for driving the display and a light source driving voltage. When the driving element DT of the pixel circuit is driven by a p-channel TFT, the lower the gate voltage, the greater the amount of current. Therefore, as the gamma compensation voltage outputted from the gamma compensation voltage generator 305 decreases, the pixel and the light emitting element OLED of the light source for sensing may emit light with higher luminance.

The gamma compensation voltage generator 305 includes an input voltage selection unit, a grayscale voltage generation unit 700 that generates the gamma compensation voltage for display driving, and a light source driving voltage generation unit 600.

The gamma compensation voltage generator 305 includes a plurality of voltage divider circuits and a plurality of multiplexers. The voltage divider circuit divides a voltage between a high potential voltage and a low potential voltage using resistors connected in series, and outputs voltages having different voltage levels. Each of the multiplexers selects a voltage indicated by a resistor setting value among the voltages divided by the voltage divider circuit. In each of the display mode and the fingerprint recognition mode, the timing controller 303 may input the register setting value to the control terminals of the multiplexers to adjust the voltage levels of output voltages V0 to V256 of the gamma compensation voltage generator 305 for each mode. The register setting value is defined by register setting data stored in the memory 302 and may be updated.

The input voltage selection unit includes a voltage divider circuit RS01, a multiplexer MUX01 that selects the highest grayscale voltage V255 according to a first register setting value, a multiplexer MUX02 that selects a lower gamma compensation voltage according to a second register setting value, and a multiplexer MUX03 that outputs the lowest gamma compensation voltage V0 according to a third register setting value. The voltage V255 outputted from the multiplexer MUX01 is supplied to the voltage divider circuits of the grayscale voltage generation unit 700 and the light source driving voltage generation unit 600. The voltage outputted from the multiplexer MUX01 is supplied to the voltage divider circuit of the grayscale voltage generation unit 700.

The light source driving voltage generation unit 600 includes a tenth voltage divider circuit RS10 and multiplexers MUX10 and MUX20 connected between a VRL node and a V255 node. The voltage divider circuit RS10 divides a voltage between the low potential input reference voltage VRL and the highest grayscale voltage V255. The output voltages of the voltage divider circuit RS10 have voltage levels of a higher grayscale than the highest grayscale voltage V255. The multiplexer MUX10 selects one of the voltages divided by the voltage divider circuit RS10 according to a fourth register setting value and outputs a light source driving voltage (DBV interlocking voltage) that varies depending on a display brightness value (DBV). The DBV is luminance setting data for varying luminance depending on an illuminance sensor output signal of the host system 200 or a luminance input value of a user. Depending on the DBV, the register setting value that individually controls each of the multiplexers may vary. The output voltage of the multiplexer MUX10 is selected in a grayscale voltage range higher than the highest grayscale voltage V255.

In the fingerprint recognition mode, since the display pixels in the sensing area SA are driven as light sources, they may emit light with a luminance higher than that of the display area DA. In this case, the data voltage applied to the display pixels in the sensing area SA in the fingerprint recognition mode may be applied as a light source driving voltage V256 having a grayscale higher than the highest grayscale voltage V255 of the display mode.

The multiplexer MUX20 selects one of a separate reference voltage (DBV non-interlocking voltage) set independently of the DBV under the control of the host system 200 and the DBV interlocking voltage outputted from the multiplexer MUX10 to output the light source driving voltage V256. The DBV non-interlocking voltage is a voltage of a higher grayscale than the highest grayscale voltage V255. The host system 200 may control the output voltage of the multiplexer MUX20 using an enable signal EN in the fingerprint recognition mode. Accordingly, the DBF interlocking voltage or the DBV non-interlocking voltage outputted from the multiplexer MUX20 is the light source driving voltage V256 higher than the highest grayscale voltage V255

The grayscale voltage generation unit 700 includes a plurality of voltage divider circuits RS11 to RS17 and a plurality of multiplexers MUX11 to MUX18.

A first-first voltage divider circuit RS11 divides a voltage between the output voltage of a first multiplexer MUX01 and the output voltage of a second multiplexer MUX02. A first-first multiplexer MUX11 selects any one of the voltages divided by the voltage divider circuit RS11 according to the register setting value. The output voltage of the first-first multiplexer MUX11 is outputted through a buffer and may be a voltage V191 of grayscale 191. A first-second voltage divider circuit RS12 divides a voltage between the output voltage of the first-first multiplexer MUX11 and the output voltage of the second multiplexer MUX02. The first-second multiplexer MUX12 selects any one of the voltages divided by the voltage divider circuit RS12 according to the register setting value. The output voltage of the first-second multiplexer MUX12 is outputted through a buffer and may be a voltage V127 of grayscale 127.

A first-third voltage divider circuit RS13 divides a voltage between the output voltage of the first-second multiplexer MUX12 and the output voltage of the second multiplexer MUX02. A first-third multiplexer MUX13 selects any one of the voltages divided by the voltage divider circuit RS13 according to the register setting value. The output voltage of the first-third multiplexer MUX13 is outputted through a buffer and may be a voltage V63 of grayscale 63. A first-fourth voltage divider circuit RS14 divides a voltage between the output voltage of the first-third multiplexer MUX13 and the output voltage of the second multiplexer MUX02. The first-fourth multiplexer MUX14 selects any one of the voltages divided by the voltage divider circuit RS14 according to the register setting value. The output voltage of the first-fourth multiplexer MUX14 is outputted through a buffer and may be a voltage V31 of grayscale 31.

A first-fifth voltage divider circuit RS15 divides a voltage between the output voltage of the first-fourth multiplexer MUX14 and the output voltage of the second multiplexer MUX02. A first-fifth multiplexer MUX15 selects any one of the voltages divided by the voltage divider circuit RS15 according to the register setting value. The output voltage of the first-fifth multiplexer MUX15 is outputted through a buffer and may be a voltage V15 of grayscale 15. A first-sixth voltage divider circuit RS16 divides a voltage between the output voltage of the first-fifth multiplexer MUX15 and the output voltage of the second multiplexer MUX02. A first-sixth multiplexer MUX16 selects any one of the voltages divided by the voltage divider circuit RS16 according to the register setting value. The output voltage of the first-sixth multiplexer MUX16 is outputted through a buffer and may be a voltage V7 of grayscale 7.

A first-seventh divider circuit RS17 divides a voltage between the output voltage of the first-sixth multiplexer MUX16 and the output voltage of the second multiplexer MUX02. A first-seventh multiplexer MUX17 selects any one of the voltages divided by the voltage divider circuit RS17 according to the register setting value. The output voltage of the first-seventh multiplexer MUX17 is outputted through a buffer and may be a voltage V1 and V4 of grayscales 1 and 4. A first-eighth multiplexer MUX18 selects any one of the voltages divided by the voltage divider circuit RS17 according to the register setting value. The output voltage of the first-eighth multiplexer MUX18 is outputted through a buffer and may be a voltage V1 of grayscale 1.

The grayscale voltage generation unit 700 further includes a plurality of voltage divider circuits RS21 to RS28. A second-first voltage divider circuit RS21 divides a voltage between the highest gamma compensation voltage V255 and the voltage V191 of grayscale 191 to output a gamma compensation voltage between the highest grayscale and the grayscale 191. A second-second voltage divider circuit RS22 divides a voltage between the voltage V191 of grayscale 191 and the voltage V127 of grayscale 127 to output a gamma compensation voltage between the grayscale 191 and the grayscale 127. A second-third voltage divider circuit RS23 divides a voltage between the voltage V127 of grayscale 127 and the voltage V63 of grayscale 63 to output a gamma compensation voltage between the grayscale 127 and the grayscale 63. A second-fourth voltage divider circuit RS24 divides a voltage between the voltage V63 of grayscale 63 and the voltage V31 of grayscale 31 to output a gamma compensation voltage between the grayscale 63 and the grayscale 31. A second-fifth voltage divider circuit RS25 divides a voltage between the voltage V31 of grayscale 31 and the voltage V15 of grayscale 15 to output a gamma compensation voltage between the grayscale 31 and the grayscale 15. A second-sixth voltage divider circuit RS26 divides a voltage between the voltage V15 of grayscale 15 and the voltage V7 of grayscale 7 to output a gamma compensation voltage between the grayscale 15 and the grayscale 7. A second-seventh voltage divider circuit RS27 divides a voltage between the voltage V7 of grayscale 7 and the voltage V4 of grayscale 4 to output a gamma compensation voltage between the grayscale 7 and the grayscale 4. A second-eighth voltage divider circuit RS28 divides a voltage between the voltage V4 of grayscale 4 and the voltage V1 of grayscale 1 to output a gamma compensation voltage between the grayscale 4 and the grayscale 1.

The gamma compensation voltage generator 305 may include an R gamma compensation voltage generator, a G gamma compensation voltage generator, and a B gamma compensation voltage generator to obtain an optimum gamma compensation voltage for each color of the sub-pixels. In this case, the register setting value may be set to different voltages in the R gamma compensation voltage generator, the G gamma compensation voltage generator, and the B gamma compensation voltage generator. A gamma compensation voltage outputted from the R gamma compensation voltage generator is a grayscale voltage of a data voltage to be supplied to the R sub-pixel. Gamma compensation voltages V0 to V256 outputted from the G gamma compensation voltage generator are grayscale voltages of a data voltage to be supplied to the G sub-pixel. A gamma compensation voltage outputted from the B gamma compensation voltage generator is a grayscale voltage of a data voltage to be supplied to the B sub-pixel.

The gamma compensation voltages V0 to V255 for each grayscale and the light source driving voltage V256 are inputted to the DAC of the data driver 306. The DAC of the data driver 306 converts the pixel data received from the timing controller 303 into a gamma compensation voltage having a different voltage for each grayscale to generate the data voltage Vdata for driving the display. In the fingerprint recognition mode, the data driver 306 converts the light source driving data received from the timing controller 303 into the light source driving voltage V256 and supplies it to the display pixels, which are used as light sources, in the sensing area SA through the data line.

Since the PPI of the sensing area SA is lower than that of the display area DA, if the pixels of the display area DA and the pixels of the sensing area SA are driven with the same data voltage in the same grayscale, the luminance of the sensing area SA may be lowered. In the present disclosure, by changing the register setting value of the gamma compensation voltage generator 305 in the fingerprint sensing mode, the data voltage range applied to the display pixels in the sensing area SA may be expanded, thereby increasing the luminance of the pixels in the sensing area SA.

Figure 23:
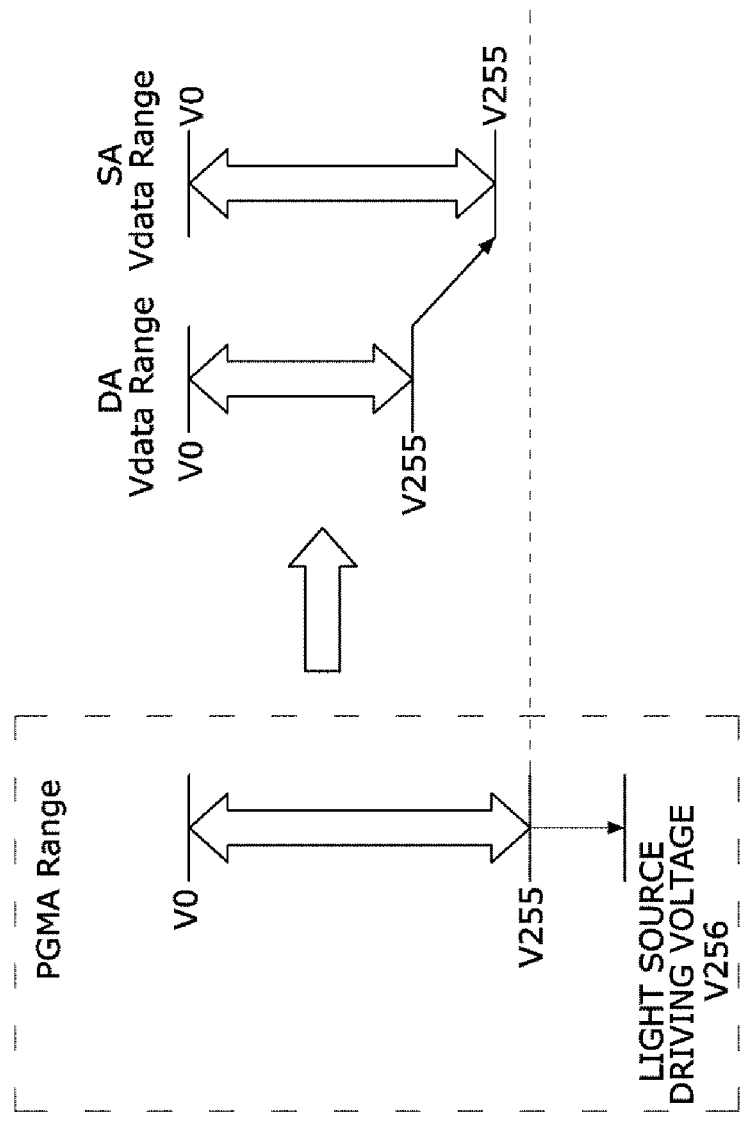
FIG. 23 is a diagram illustrating a data voltage applied to pixels in a display area and a data voltage applied to pixels in a sensing area.

FIG. 23 is a diagram illustrating a data voltage applied to pixels in a display area and a data voltage applied to pixels in a sensing area. In FIG. 23, "PGMA Range" indicates an output voltage range of the gamma compensation voltage generator 305.

Referring to FIG. 23, since the PPI of the sensing area SA is low, the data driver 306 increases the range of the data voltage Vdata applied to the pixels of the sensing area SA rather than the range of the data voltage Vdata applied to the pixels of the display area DA.

The features to be achieved by the present disclosure, the means for achieving the features, and effects of the present disclosure described above do not specify essential features of the claims, and thus, the scope of the claims is not limited to the disclosure of the present disclosure.

Although the aspects of the present disclosure have been described in more detail with reference to the accompanying drawings, the present disclosure is not limited thereto and may be embodied in many different forms without departing from the technical concept of the present disclosure. Therefore, the aspects disclosed in the present disclosure are provided for illustrative purposes only and are not intended to limit the technical concept of the present disclosure. The scope of the technical concept of the present disclosure is not limited thereto. Therefore, it should be understood that the above-described aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device comprising:
    a display area in which a first group of display pixels to which pixel data is written are arranged, each of the display pixels in the display area including a pixel circuit configured to drive a light emitting element;
    a sensing area in which a second group of display pixels and a plurality of sensor pixels are arranged, each of the display pixels in the sensing area including a pixel circuit configured to drive a light emitting element, and each of the sensor pixels including a photosensor driving circuit configured to drive a photodiode;
    a low potential power voltage and a pixel driving voltage are applied to the pixel circuit and the photosensor driving circuit, and
    a cathode electrode of the light emitting element and a cathode electrode of the photodiode sharing a same metal electrode and commonly connected to a low potential power line to which the low potential power voltage is applied,
    wherein the display area excludes the sensing area, and pixels per inch (PPI) of the second group is less than the PPI of the first group,
    wherein the photosensor driving circuit includes:
    the photodiode;
    a capacitor; and
    a switch element controlled by an exposure signal,
    wherein the switch element includes:
    a gate electrode to which the exposure signal is applied;
    a first electrode connected to an anode electrode of the photodiode;
    and a second electrode connected to the capacitor,
    wherein the exposure signal includes a pulse generated during a reset time and an exposure time,
    wherein each of the pixel driving voltage and the low potential power voltage includes a pulse generated during the reset time, and
    wherein the capacitor of the photosensor driving circuit is electrically connected to the anode electrode of the photodiode through the switch element turned on during the reset time and the exposure time.

2. The display device of claim 1, wherein an anode electrode of the light emitting element and the anode electrode of the photodiode are divided into a metal pattern formed on a same layer to be electrically separated.

3. The display device of claim 1, wherein the photodiode includes an organic photodiode including an organic semiconductor.

4. The display device of claim 3, wherein the pixel circuit includes:
    a driving element configured to drive the light emitting element;
    a first capacitor configured to maintain a gate voltage of the driving element; and
    a switch circuit connected to:
        a first power line to which the pixel driving voltage is applied,
        a second power line to which an initialization voltage is applied,
        a third power line to which the low potential power voltage is applied,
        a data line to which a data voltage is applied,
        a first gate line to which a first scan pulse generated as a gate-on voltage is applied during a sampling period,
        a second gate line to which a second scan pulse generated as the gate-on voltage is applied during an initialization period prior to the sampling period, and
        a third gate line to which an EM pulse generated as a gate-off voltage is applied during the initialization period and the sampling period, and configured to switch a voltage applied to an electrode of the driving element.

5. The display device of claim 4, wherein the photosensor driving circuit further includes:
    a switch circuit connected to the first power line, the second gate line, a fourth gate line to which the pulse of the exposure signal is applied, and an RX line through which a photoelectric conversion signal is transmitted.

6. The display device of claim 5, wherein the driving element includes a first electrode connected to a first node, a gate connected to a second node, and a second electrode connected to a third node, and an anode electrode of the light emitting element is connected to a fourth node, and the cathode electrode of the light emitting element is connected to the third power line, a storage capacitor is connected between the first power line and the first node.

7. The display device of claim 6, wherein the switch circuit of the pixel circuit includes:
    a first switch element having a gate electrode connected to the first gate line, a first electrode connected to the second node, and a second electrode connected to the third node;
    a second switch element having a gate electrode connected to the first gate line, a first electrode connected to the first node, and a second electrode connected to the data line;
    a third switch element having a gate electrode connected to the third gate line, a first electrode connected to the first power line, and a second electrode connected to the first node;
    a fourth switch element having a gate electrode connected to the third gate line, a first electrode connected to the third node, and a second electrode connected to the fourth node;
    a fifth switch element having a gate electrode connected to the second gate line, a first electrode connected to the second node, and a second electrode connected to the second power line; and
    a sixth switch element having a gate electrode connected to the first gate line, a first electrode connected to the second power line, and a second electrode connected to the fourth node.

8. The display device of claim 7, wherein the capacitor of the photosensor driving circuit is connected between a fifth node and the first power line, and wherein the switch circuit of the photosensor driving circuit further includes:
a first-S switch element having a gate electrode connected to the second gate line, a first electrode connected to the RX line, and a second electrode connected to a sixth node; and
a second-S switch element having a gate electrode connected to the fifth node, a first electrode connected to the sixth node, and a second electrode connected to the first power line;
wherein the gate electrode of the switch element is connected to the fourth gate line, and the second electrode of the switch element is connected to the fifth node.

9. The display device of claim 8, wherein the driving element and the first to sixth switch elements of the pixel circuit are p-channel transistors, and
wherein the switch element, the first-S switch element and the second-S switch element of the photosensor driving circuit are p-channel transistors.

10. The display device of claim 7, wherein the low potential power voltage and the pixel driving voltage have a same fluctuation width during the reset time.

11. The display device of claim 7, wherein the switch element of the photosensor driving circuit is an n-channel transistor, and
wherein the driving element and the first to sixth switch elements of the pixel circuit and the first and second S switch elements of the photosensor driving circuit are p-channel transistors.

12. The display device of claim 5, wherein the pulse of the exposure signal is generated as a gate-on voltage during the reset time and the exposure time in a vertical blank period,
each of the low potential power voltage and the pixel driving voltage decreases by a preset voltage during the reset time and then increases during the exposure time and an active interval, and
the first scan pulse, the second scan pulse, and the EM pulse are generated within the active interval.

13. The display device of claim 5, wherein the pulse of the exposure signal is generated as a gate-on voltage,
each of the low potential power voltage and the pixel driving voltage decreases by a preset voltage during the reset time and then increases during the exposure time and an active interval,
the first scan pulse, the second scan pulse, and the EM pulse are generated within the active interval, and
the pulse of the exposure signal is generated as the gate-on voltage in the vertical blank period to be maintained at the gate-on voltage until at least a part of the active interval.

14. The display device of claim 5, wherein the pulse of the exposure signal overlaps with a scan pulse of the display area.

15. A mobile terminal comprising:
a display panel including a display area in which a first group of display pixels are arranged, and a sensing area in which a second group of display pixels and a plurality of sensor pixels are arranged; and
a fingerprint recognition processor configured to generate a fingerprint pattern image data from a signal photoelectrically converted by the sensor pixels in the sensing area, wherein
a low potential power voltage and a pixel driving voltage are applied to a pixel circuit and a photosensor driving circuit, and a cathode electrode of the light emitting element and a cathode electrode of the photodiode share the same metal electrode and are commonly connected to a low potential power line to which the low potential power voltage is applied,
wherein each of the display pixels includes the pixel circuit configured to drive a light emitting element, and each of the sensor pixels includes the photosensor driving circuit configured to drive a photodiode,
wherein the display area excludes the sensing area, and pixels per inch (PPI) of the second group is less than the PPI of the first group,
wherein the photosensor driving circuit includes:
the photodiode;
a capacitor; and
a switch element controlled by an exposure signal,
wherein the switch element includes:
a gate electrode to which an exposure signal is applied;
a first electrode connected to an anode electrode of the photodiode;
and a second electrode connected to the capacitor,
wherein the exposure signal includes a pulse generated during a reset time and an exposure time,
wherein each of the pixel driving voltage and the low potential power voltage includes a pulse generated during the reset time, and
wherein the capacitor of the photosensor driving circuit is electrically connected to the anode electrode of the photodiode through the switch element turned on during the reset time and the exposure time.

16. A display device comprising:
a display area in which a first group of display pixels to which pixel data is written are arranged, each of the display pixels in the display area including a pixel circuit configured to drive a light emitting element;
a sensing area in which a second group of display pixels and a plurality of sensor pixels are arranged, each of the display pixels in the sensing area including a pixel circuit configured to drive a light emitting element, and each of the sensor pixels including a photosensor driving circuit configured to drive a photodiode;
a low potential power voltage and a pixel driving voltage are applied to the pixel circuit and the photosensor driving circuit, and
a cathode electrode of the light emitting element and a cathode electrode of the photodiode sharing a same metal electrode and commonly connected to a low potential power line to which the low potential power voltage is applied,
wherein the photosensor driving circuit includes:
a first switch element, a second switch element, a third switch controlled by an exposure signal, and a capacitor connected between a gate electrode of the second switch element and a power line to which the pixel driving voltage is applied,
wherein:
the first switch element has a gate electrode connected to a gate line to which a scan pulse is applied, a first electrode connected to a RX line, and a second electrode;
a first electrode of the second switch element is connected to the second electrode of the first switch element, and a second electrode of the second switch element is connected to the power line, and
the third switch element has a gate electrode to which the exposure signal is applied, a first electrode connected to an anode electrode of the photodiode, and a second electrode connected to the capacitor, the exposure signal includes a pulse generated during a reset time and an exposure time, each of the pixel driving voltage and the low potential power voltage includes a pulse generated during the reset time, and the capacitor of the photosensor driving circuit is electrically connected to the anode electrode of the photodiode through the third switch element turned on during the reset time and the exposure time.

17. The display device of claim 16, wherein switch elements of the pixel circuit and the first to third switch elements of the photosensor driving circuit are p-channel transistors.

18. The display device of claim 16, wherein the low potential power voltage and the pixel driving voltage have a same fluctuation width during the reset time.

19. The display device of claim 16, wherein a forward bias is applied to the photodiode during the reset time, and a reverse bias is applied to the photodiode during the exposure time.

* * * * *